(12) United States Patent
Kobayashi et al.

(10) Patent No.: US 11,348,783 B2
(45) Date of Patent: May 31, 2022

(54) METHODS AND APPARATUS FOR DYNAMICAL CONTROL OF RADIAL UNIFORMITY WITH TWO-STORY MICROWAVE CAVITIES

(71) Applicant: APPLIED MATERIALS, INC., Santa Clara, CA (US)

(72) Inventors: Satoru Kobayashi, Sunnyvale, CA (US); Hideo Sugai, A'ichi (JP); Denis Ivanov, St Peterburg (RU); Lance Scudder, Sunnyvale, CA (US); Dmitry Lubomirsky, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 152 days.

(21) Appl. No.: 16/562,002

(22) Filed: Sep. 5, 2019

(65) Prior Publication Data
US 2021/0074539 A1 Mar. 11, 2021

(51) Int. Cl.
*H01J 37/32* (2006.01)
*H01L 21/02* (2006.01)
*H05B 6/64* (2006.01)

(52) U.S. Cl.
CPC .. *H01L 21/02252* (2013.01); *H01J 37/32192* (2013.01); *H01J 37/32201* (2013.01); *H01J 37/32229* (2013.01); *H01J 37/32311* (2013.01); *H05B 6/6402* (2013.01)

(58) Field of Classification Search
CPC ........... H01J 37/32192; H01J 37/32201; H01J 37/32229; H01J 37/32311; H01L 21/02252; H05B 6/6402
See application file for complete search history.

(56) References Cited

U.S. PATENT DOCUMENTS

| 5,531,184 | A | * | 7/1996 | Muranaka | ............ C23C 16/274 |
| | | | | | 117/108 |
| 9,299,537 | B2 | | 3/2016 | Kobayashi et al. | |
| 9,299,538 | B2 | | 3/2016 | Kobayashi et al. | |
| 9,564,296 | B2 | | 2/2017 | Kobayashi et al. | |
| 9,837,249 | B2 | | 12/2017 | Kobayashi et al. | |

(Continued)

OTHER PUBLICATIONS

International Search Report and Written Opinion for PCT/US2020/048752 dated Dec. 7, 2020.

(Continued)

*Primary Examiner* — Kurtis R Bahr
(74) *Attorney, Agent, or Firm* — Moser Taboada

(57) ABSTRACT

Methods and apparatus provide plasma generation for semiconductor process chambers. In some embodiments, the plasma is generated by a system that may comprise a process chamber having at least two upper microwave cavities separated from a lower microwave cavity by a metallic plate with a plurality of radiation slots, at least one microwave input port connected to a first one of the at least two upper microwave cavities, at least two microwave input ports connected to a second one of the at least two upper microwave cavities, and the lower microwave cavity receives radiation through the plurality of radiation slots in the metallic plate from both of the at least two upper microwave cavities, the lower microwave cavity is configured to form an electric field that provides uniform plasma distribution in a process volume of the process chamber.

20 Claims, 20 Drawing Sheets

(56) References Cited

U.S. PATENT DOCUMENTS

| | | | |
|---|---|---|---|
| 2016/0276139 A1 | 9/2016 | Osada et al. | |
| 2016/0284519 A1 | 9/2016 | Kobayashi et al. | |
| 2017/0040145 A1 | 2/2017 | Brandon et al. | |
| 2017/0076956 A1* | 3/2017 | Hirayama | H01J 37/3266 |
| 2017/0125219 A1 | 5/2017 | Kobayashi et al. | |
| 2017/0148610 A1* | 5/2017 | Wada | H01J 37/32165 |
| 2017/0330727 A1* | 11/2017 | Lee | H01J 37/32238 |
| 2018/0053634 A1 | 2/2018 | Kraus et al. | |
| 2018/0226230 A1* | 8/2018 | Kobayashi | H01J 37/3299 |
| 2018/0294143 A1 | 10/2018 | Chua et al. | |
| 2018/0323043 A1 | 11/2018 | Kraus et al. | |
| 2019/0189399 A1* | 6/2019 | Kobayashi | H01J 37/32229 |

OTHER PUBLICATIONS

Microwave plasma generation by the fast rotation and slow pulsation of resonant fields in a cylindrical cavity, Yuichi Hasegawa, Keiji Nakamura, Dima Lubomirsky, Soonam Park, Satoru Kobayashi, and Hideo Sugai*, Chubu University, Kasugai, Aichi 487-8501, Japan Applied Materials Inc., Santa Clara, CA 95050, U.S.A., Nagoya Industrial Science Research Institute, Nagoya 460-0008, Japan, *E-mail: sugai-h@isc.chubu.ac.jp, Received Oct. 30, 2016; revised Feb. 9, 2017; accepted Feb. 10, 2017; published online Mar. 17, 2017.

Generation of slowly rotating microwave plasma, by amplitude-modulated resonant cavity, Masaya Hotta, Yuichi Hasegawa, Keiji Nakamura, Dima Lubomirsky, Soonam Park, Satoru Kobayashi, and Hideo Sugai*, Chubu University, Kasugai, Aichi 487-8501, Japan, 2Applied Materials Inc., Santa Clara, CA 95050, U.S.A., Nagoya Industrial Science Research Institute, Nagoya 460-0008, Japan, *E-mail: sugai-h@isc.chubu.ac.jp. Received Jul. 24, 2017; revised Aug. 31, 2017; accepted Aug. 31, 2017; published online Oct. 19, 2017.

Control of Microwave Plasma with Use of Multi-hollow Dielectric Plate Iji Liang, Shu Ohta, Kimitaka Kato, Keiji Nakamura, Ivan P. Ganachev,and Hideo Sugai, Graduate School of Engineering, Chubu University, Kasugai 487-8501, Japan Nagoya Industrial Research Institute, Nagoya 464-0819, Japan Shibaura Mechatronics Corp., Sakae-ku, Yokohama 247-0006, Japan.

Multi-Hollow Plasma Production along Dielectric Plate in Microwave Discharge Sachiko Nakao_ and Hideo Sugai, Department of Electrical Engineering and Computer Science, Nagoya University, Furo-cho, Chikusa-ku, Nagoya 464-8603, Japan Department of Electronic Engineering and Computer Science, Chubu University, 1200 Matsumoto-cho, Kasugai, Aichi 487-8501, Japan (Received Sep. 2, 2007; accepted Oct. 18, 2007; published online Nov. 2, 2007.

* cited by examiner

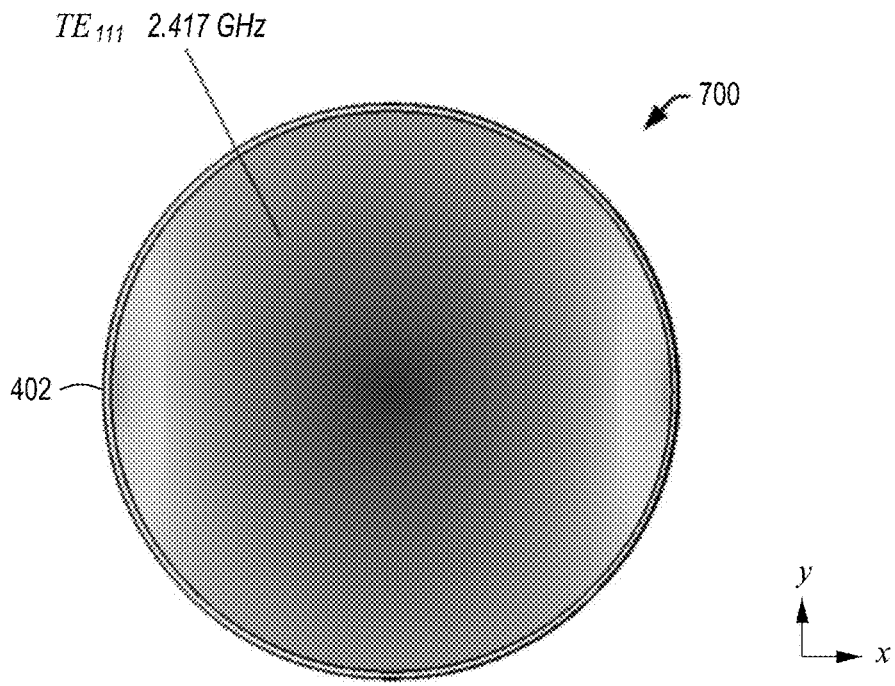

$TE_{111}$ 2.417 GHz

FIG. 7

$\frac{\Omega_i}{2\pi} = 1 - 10{,}000$ Hz

| | Carrier frequency $f_i = \omega_i/2\pi$ (GHz) | Set - A | Set - B |
|---|---|---|---|
| m = 1 | 2.417 | $V_1 \cos\Omega_1 t \cdot \cos\omega_1 t$ | $V_1 \cos(\Omega_1 t - \frac{\pi}{2}) \cdot \cos\omega_1 t$ |
| m = 3 | 2.474 | $V_3 \cos\Omega_3 t \cdot \cos\omega_3 t$ | $V_3 \cos(\Omega_3 t + \frac{\pi}{2}) \cdot \cos\omega_3 t$ |

FIG. 8A $\frac{\omega_i}{2\pi}$

| | Carrier frequency $f_i = \omega_i/2\pi$ (GHz) | Set - A | Set - B |
|---|---|---|---|
| m = 1 | 2.417 | $V_1 \cdot \cos\omega_1 t$ | $V_1 \cdot \cos(\omega_1 t - \frac{\pi}{2})$ |
| m = 3 | 2.474 | $V_3 \cdot \cos\omega_3 t$ | $V_3 \cdot \cos(\omega_3 t + \frac{\pi}{2})$ |

FIG. 8B

METHODS AND APPARATUS FOR DYNAMICAL CONTROL OF RADIAL UNIFORMITY WITH TWO-STORY MICROWAVE CAVITIES

FIELD

Embodiments of the present principles generally relate to semiconductor processing.

BACKGROUND

Semiconductor process chambers are used to deposit and etch materials onto a substrate, often using plasma to assist with the deposition and the etching of the materials. Microwave plasma systems use microwaves to create and maintain the plasma during the semiconductor processes. The most commonly used plasma systems use a radio frequency (RF) of 13.56 MHz for excitation. Microwave systems, however, are usually excited at 2.450 GHz. Early microwave plasma systems suffered from frequency and power instability, making the systems hard to excite with poor uniformity during production. Because microwave-based systems produce much higher radical densities compared to 13.56 MHz RF plasma systems, the microwave-based systems are still desirable for use in the semiconductor industry. However, uniformity of the plasma in a microwave-based system has been a significant problem.

Accordingly, the inventors have provided an improved method and apparatus for controlling uniformity of plasma in a microwave-based semiconductor processing system.

SUMMARY

Methods and apparatus for generating plasma for a semiconductor process are provided herein.

In some embodiments, a system for generating plasma for a semiconductor process may comprise a process chamber having at least two upper microwave cavities separated from a lower microwave cavity by a metallic plate with a plurality of radiation slots, at least one microwave input port connected to a first one of the at least two upper microwave cavities, at least two microwave input ports connected to a second one of the at least two upper microwave cavities, and the lower microwave cavity receives radiation through the plurality of radiation slots in the metallic plate from both of the at least two upper microwave cavities, the lower microwave cavity is configured to form an electric field that provides uniform plasma distribution in a process volume of the process chamber.

In some embodiments, the system may further include wherein the first one of the at least two upper microwave cavities is a square cavity in at least two dimensions, wherein the first one of the at least two upper microwave cavities is an air cavity, a tuner on the first one of the at least two upper microwave cavities configured to adjust microwave excitation in the first one of the at least two upper microwave cavities and to act as a bandpass filter for frequencies of center-high modes, wherein the first one of the at least two upper microwave cavities is a coaxial air cavity, wherein the coaxial air cavity excites an m=0 mode, wherein the coaxial air cavity has two different circular dimensions, wherein the second one of the at least two upper microwave cavities is a toroidal cavity, wherein the second one of the at least two upper microwave cavities is an air cavity, a tuner on the second one of the at least two upper microwave cavities configured to adjust microwave excitation in the second one of the at least two upper microwave cavities and to act as a bandpass filter for frequencies of edge-high modes, wherein the first one of the at least two upper microwave cavities supports a center-high mode of microwave excitation and the second one of the at least two upper microwave cavities supports an edge high mode of microwave excitation, wherein the at least two upper microwave cavities are configured to form an electric field in the lower microwave cavity that produces a uniform plasma by adjusting a power ratio of center-high mode to edge-high mode in the at least two upper microwave cavities, and/or at least one microwave monitor that interacts with at least one of the at least two upper microwave cavities or the lower microwave cavity to monitor a single frequency or a plurality of frequencies for each of the at least one microwave monitor, the at least one microwave monitor configured to provide feedback to a system controller for adjusting microwave parameters.

In some embodiments, a system for generating plasma for a semiconductor process may comprise a first upper microwave cavity that excites center-high modes, a second upper microwave cavity that excites edge high modes, the second upper microwave cavity surrounding the first upper microwave cavity, a metallic plate beneath the first upper microwave cavity and the second upper microwave cavity, the metallic plate has a plurality of radiation slots configured to radiate center-high modes from the first upper microwave cavity and edge-high modes from the second upper microwave cavity, and a lower microwave cavity that receives radiated center-high modes from the first upper microwave cavity and edge-high modes from the second upper microwave cavity, the lower microwave cavity configured to provide an electric field for uniform plasma distribution in a process chamber.

In some embodiments, the system may further include wherein the first upper microwave cavity and the second upper microwave cavity are air cavities and the lower microwave cavity is a quartz cavity, wherein the quartz cavity has a plurality of holes therethrough, wherein the first upper microwave cavity is a square cavity in at least two dimensions and the second upper microwave cavity is a toroidal cavity surrounding the square cavity, and/or a first tuner on the first upper microwave cavity configured to adjust microwave excitation in the first upper microwave cavity and to act as a bandpass filter for frequencies of center-high modes and a second tuner on the second upper microwave cavity configured to adjust microwave excitation in the second upper microwave cavity and to act as a bandpass filter for frequencies of edge-high modes.

In some embodiments, a system for generating plasma for a semiconductor process may comprise a first upper microwave cavity that excites center-high modes, the first upper microwave cavity being a square air cavity, a second upper microwave cavity that excites edge high modes, the second upper microwave cavity being a toroidal air cavity that surrounds the first upper microwave cavity, a metallic plate beneath the first upper microwave cavity and the second upper microwave cavity, the metallic plate has a plurality of radiation slots configured to radiate center-high modes from the first upper microwave cavity and edge-high modes from the second upper microwave cavity, and a lower microwave cavity that receives radiated center-high modes from the first upper microwave cavity and edge-high modes from the second upper microwave cavity, the lower microwave cavity being a cylindrical quartz cavity with a plurality of holes therethrough that is configured to provide an electric field for uniform plasma distribution in a process chamber.

In some embodiments, the system may further include a first tuner on the first upper microwave cavity configured to adjust microwave excitation in the first upper microwave cavity and to act as a bandpass filter for frequencies of center-high modes and a second tuner on the second upper microwave cavity configured to adjust microwave excitation in the second upper microwave cavity and acts as a bandpass filter for frequencies of edge-high modes, wherein the first upper microwave cavity and the second upper microwave cavity are configured to generate an electric field in the lower microwave cavity that produces a uniform plasma by adjusting a power ratio of center-high mode to edge-high mode in the first upper microwave cavity and the second upper microwave cavity, respectively.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 7 depicts an electrical field plot of a top view of the microwave input system of FIG. 4 in accordance with some embodiments of the present principles.

FIG. 8A depicts a table illustrating slow rotation microwave signal inputs for a microwave cavity in accordance with some embodiments of the present principles.

FIG. 8B depicts a table illustrating fast rotation microwave signal inputs for a microwave cavity in accordance with some embodiments of the present principles.

Figure 1:
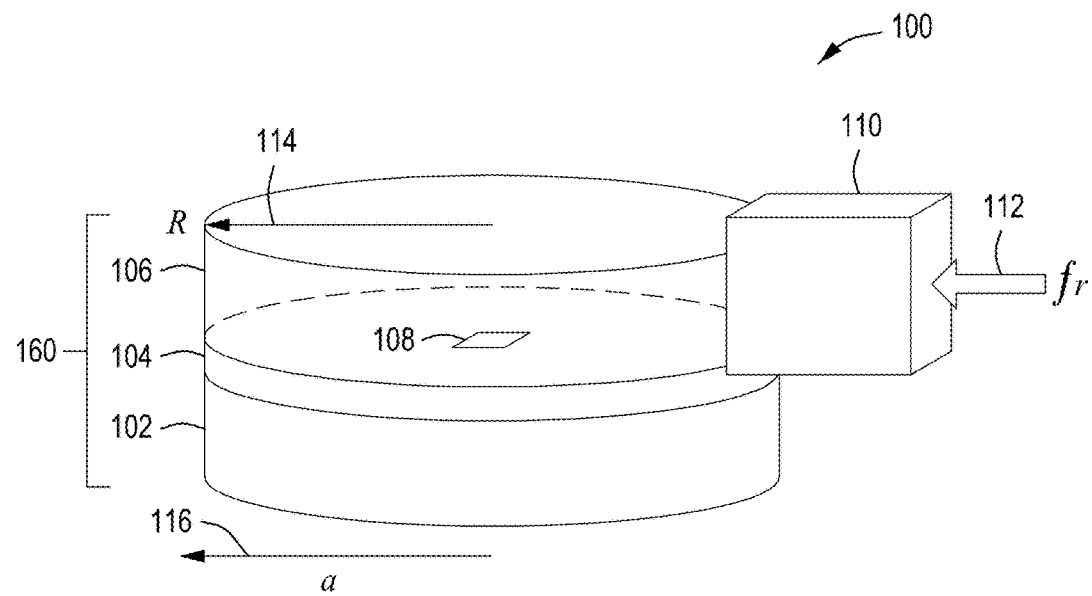
FIG. 1 depicts an isometric view of a microwave input system with a two-story cavity in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A microwave cavity that is separated by a metallic plate with a radiation slot is referred to herein as a two-story microwave cavity. The inventors have found that the two-story microwave cavity is advantageous in exciting plasma in high pressures. In some embodiments, microwaves with modes that accentuate plasma near edges of a substrate are combined with microwaves with modes that accentuate plasma near the center of the substrate to control plasma deposition uniformity. However, non-ideality in a top cavity of the two-story microwave cavity has to be resolved by mechanical tuning, which is difficult when the two modes are simultaneously excited. The methods and apparatus of the present principles include embodiments in which the two eigenmodes of center-high and edge-high are excited in a bottom cavity of the two-story microwave cavity without the issues normally encountered for simultaneous tuning of the two eigenmodes in the top cavity.

The inventors have discovered that if the top cavity of the two-story microwave cavity is separated for center-high eigenmodes (e.g., m=1) and edge-high eigenmodes (e.g., m=3), the two eigenmodes can be generated without interfering with each other. Each of the separated top cavities allows resonance for only one desired mode. Methods and apparatus of the present principles enable auto tuners connected into each cavity to operate without frequency interference, providing radial uniformity control in a systematic manner, without relying on the skills or experience of operators. In some embodiments, the power ratios and/or the field rotations of the two eigenmodes (e.g., m=1 and m=3) may be adjusted to beneficially provide control of the radial uniformity of the plasma generated in the bottom cavity of the two-story microwave cavity. The top cavities can accept high power inputs and are advantageously air cavities that have small power losses and low costs. The inventors have found that the methods and apparatus of the present principles advantageously provides high uniformity at high pressures (e.g., greater than approximately 50 Torr). In some embodiments, uniformity may be achieved at pressures of approximately 50 Torr to approximately 100 Torr. In some embodiments, uniformity may be achieved at pressures of approximately 50 Torr to approximately 200 Torr. In some embodiments, uniformity may be achieved at low pressures such as approximately 0.5 Torr to approximately 1.0 Torr. In some embodiments, the power ratio of the m=1 mode and the m=3 mode can be adjusted based on pressure to provide uniformity.

A two-story microwave cavity has a radiational slot metal plate separating a structure into a top cavity and a bottom cavity. The top cavity and the bottom cavity are weakly electrically connected via the radiational slot metal plate. Microwaves injected into the top cavity disturbs the two eigenmodes in the top cavity. Whereas in the bottom cavity, since the two eigenmodes are excited via the radiational slot metal plate, which has an optimized pattern of radiational slots, the field disturbance by the input microwaves are eliminated. As a result, plasma excited by the two modes under the bottom cavity will have theoretically ideal distributions (see, *Microwave plasma generation by the fast and slow pulsation of resonant fields in a cylindrical cavity*, Y. Hasegawa et al. Jap. J. App. Phys. vol. 56, 046203 (2017); *Generation of slowly rotating microwave plasma by amplitude-modulated resonant cavity*, M. Hotta et al. Jap. J. App. Phys. vol. 56, 116002 (2017)). In reality, designing a two-story cavity as calculated theoretically is not possible. In such a case, non-ideality in the bottom cavity can be resolved by microwave frequency tuning, whereas that in the top cavity must be absorbed by a mechanical microwave tuner. The mechanical tuning may be easily implemented when only one eigenmode is excited in the structure. However, when the two modes are simultaneously excited, highly elaborate tuning is needed, which is not practical for commercial products.

Figure 2:
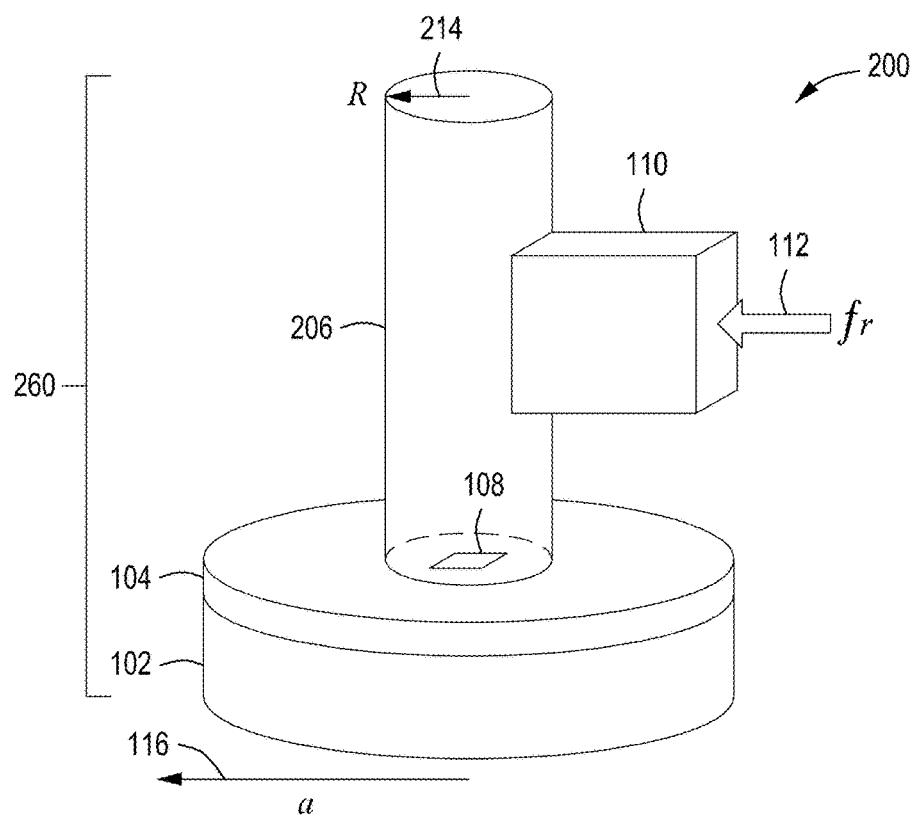
FIG. 2, depicts an isometric view of a microwave input system with a two-story cavity with a smaller top radius R in accordance with some embodiments of the present principles.
Figure 3:
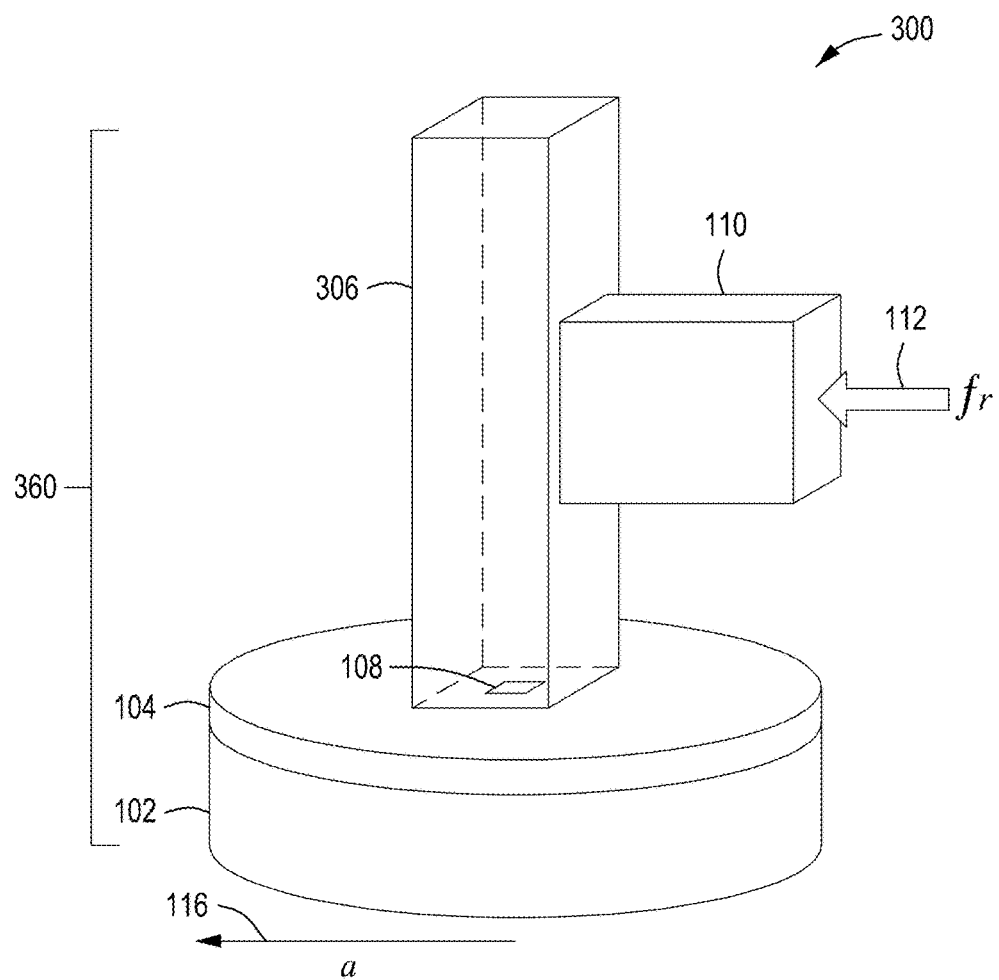
FIG. 3 depicts an isometric view of a microwave input system with a two-story cavity with a top square cavity in accordance with some embodiments of the present principles.

A top cavity for the center high mode (e.g., m=1) can be separated as shown in FIGS. 1-3. FIG. 1 is a microwave input system 100 with a two-story cavity 160 that includes a bottom cavity 102 with a bottom radius α 116, a metallic plate 104 with a radiation slot 108, a top cavity 106 with a top radius R 114, and a waveguide 110 with a side power input port 112 having a frequency $f_r$. In some embodiments, the bottom cavity 102 is filled with a dielectric material (e.g., quartz) and the top cavity is filled with air. The two-story cavity 160 of FIG. 1 has a top radius R 114 equal to the bottom radius α 116 (R=α). In a microwave input system 200 of FIG. 2, a two-story cavity 260 with a smaller top radius R 214 is shown (R>α). The top radius R 214 is reduced while maintaining the circular symmetry of the top cylindrical air cavity 206. The circular symmetry form can be applied to any mode excited in the top cylindrical air cavity 206. The m=1 (TE/TM$_{1XX}$) and m=3 (TE/TM$_{3XX}$) modes in any cylindrical cavity can be rotated by placing two input ports at a 90 degree angle (see, U.S. Patent Application Publication Serial No. 2018/0226230, published Aug. 9, 2019, entitled SYSTEMS AND METHODS FOR RADIAL AND AZIMUTHAL CONTROL OF PLASMA UNIFORMITY and U.S. Patent Application Publication Serial No. 2019/0189399, published Jun. 20, 2019, entitled METHODS AND APPARATUS FOR DYNAMICAL CONTROL OF RADIAL UNIFORMITY IN MICROWAVE CHAMBERS). In a microwave input system 300 of FIG. 3, a two-story cavity 360 is shown with a top square cavity 306. A square cavity is defined as a cavity with at least two dimensions being approximately equal and would also include rectangular cavities with a longer third dimension. The top square cavity 306 is easier to manufacture and maintain than a cylindrical cavity. With other modes (e.g., m=2 TE/TM$_{2XX}$), the rectangular form of the top square cavity 306 of FIG. 3 or other polyhedral shape must be used with the input angles as calculated per SYSTEMS AND METHODS FOR RADIAL AND AZIMUTHAL CONTROL OF PLASMA UNIFORMITY, supra, (several choices for one mode may be available, e.g., 135 degrees for m=2 mode). The two-story cavity examples shown in FIGS. 1-3 have waveguides that are mounted to excite the magnetic field component $H_z$ for illustrative purposes only—any input configuration is possible.

Figure 4:
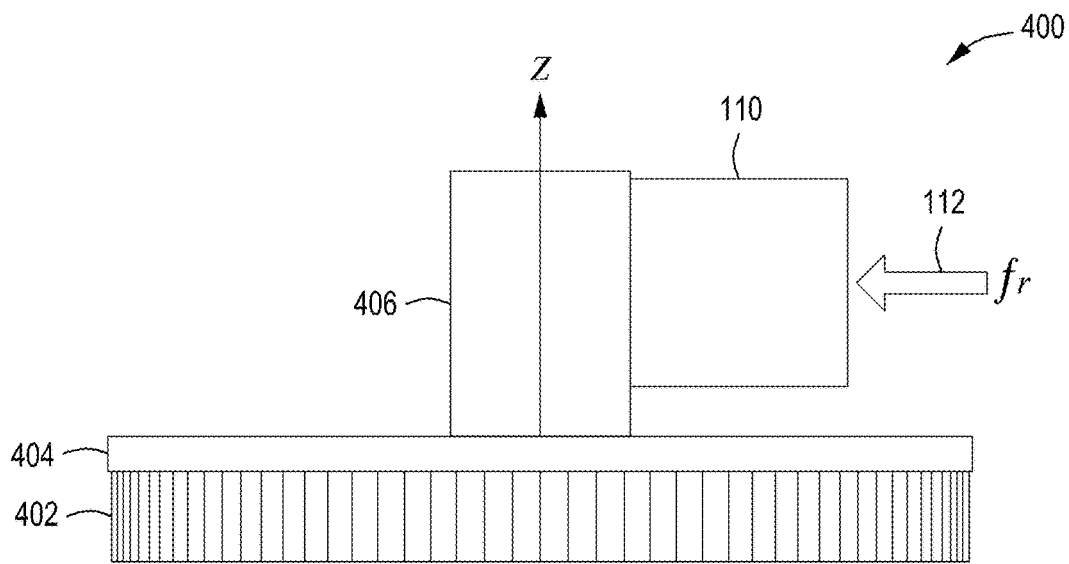
FIG. 4 depicts a side view of a microwave input system based on the two-story cavity of FIG. 3 in accordance with some embodiments of the present principles.
Figure 5:
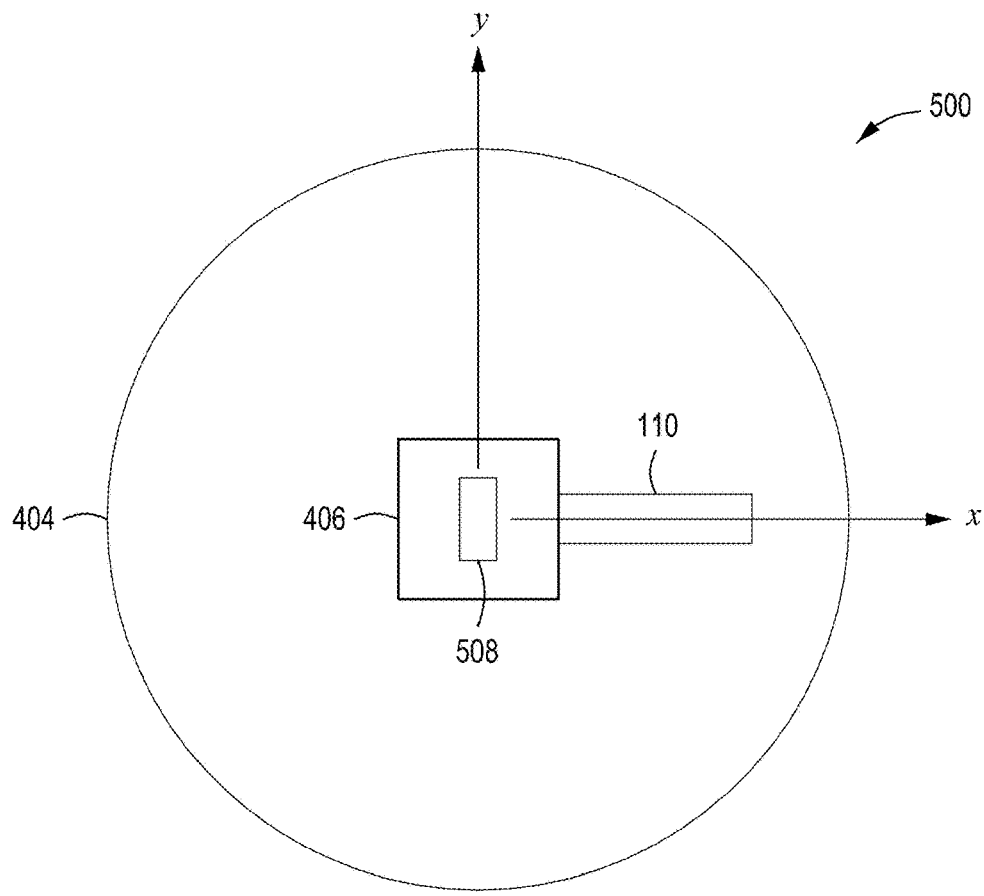
FIG. 5 depicts a top down view of the microwave input system of FIG. 4 in accordance with some embodiments of the present principles.
Figure 6:
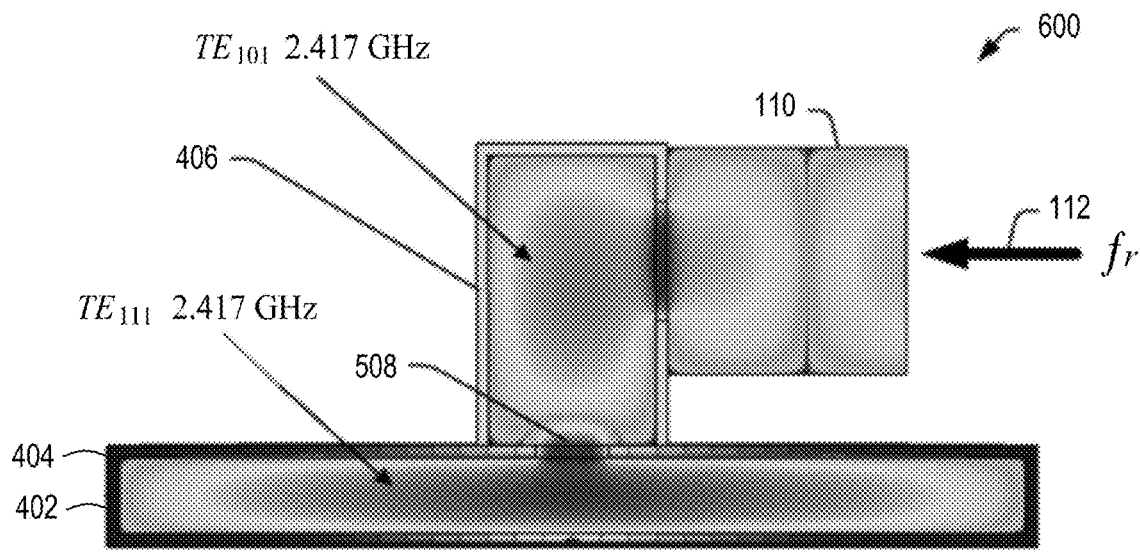
FIG. 6 depicts an electrical field plot of a side view of the microwave input system of FIG. 4 in accordance with some embodiments of the present principles.

FIG. 4 is a side view of a microwave input system 400 based on the two-story cavity 360 of FIG. 3. FIG. 5 is a top down view 500 of the microwave input system 400 of FIG. 4. A top square air cavity 406 with a rectangular shape and filled with air is connected via at least one radiation slot 508 in a metallic plate 404 to a bottom cylindrical quartz cavity 402. For the sake of brevity, but not to limit in any fashion, TE$_{101}$, or TE$_{111}$ will be used in subsequent examples in place of m=1 (i.e., TE/TM$_{1XX}$), and TM$_{310}$, or TE$_{311}$ in place of m=3 (i.e., TE/TM$_{3XX}$). When using the microwave input system 400 of FIG. 4 at 2.417 GHz, the $TE_{101}$ in the top square air cavity 406 excites the center-high $TE_{111}$ mode in the bottom cylindrical quartz cavity 402 via the at least one radiation slot 508 as illustrated in a plot 600 of FIG. 6 and a plot 700 of FIG. 7.

Figure 9:
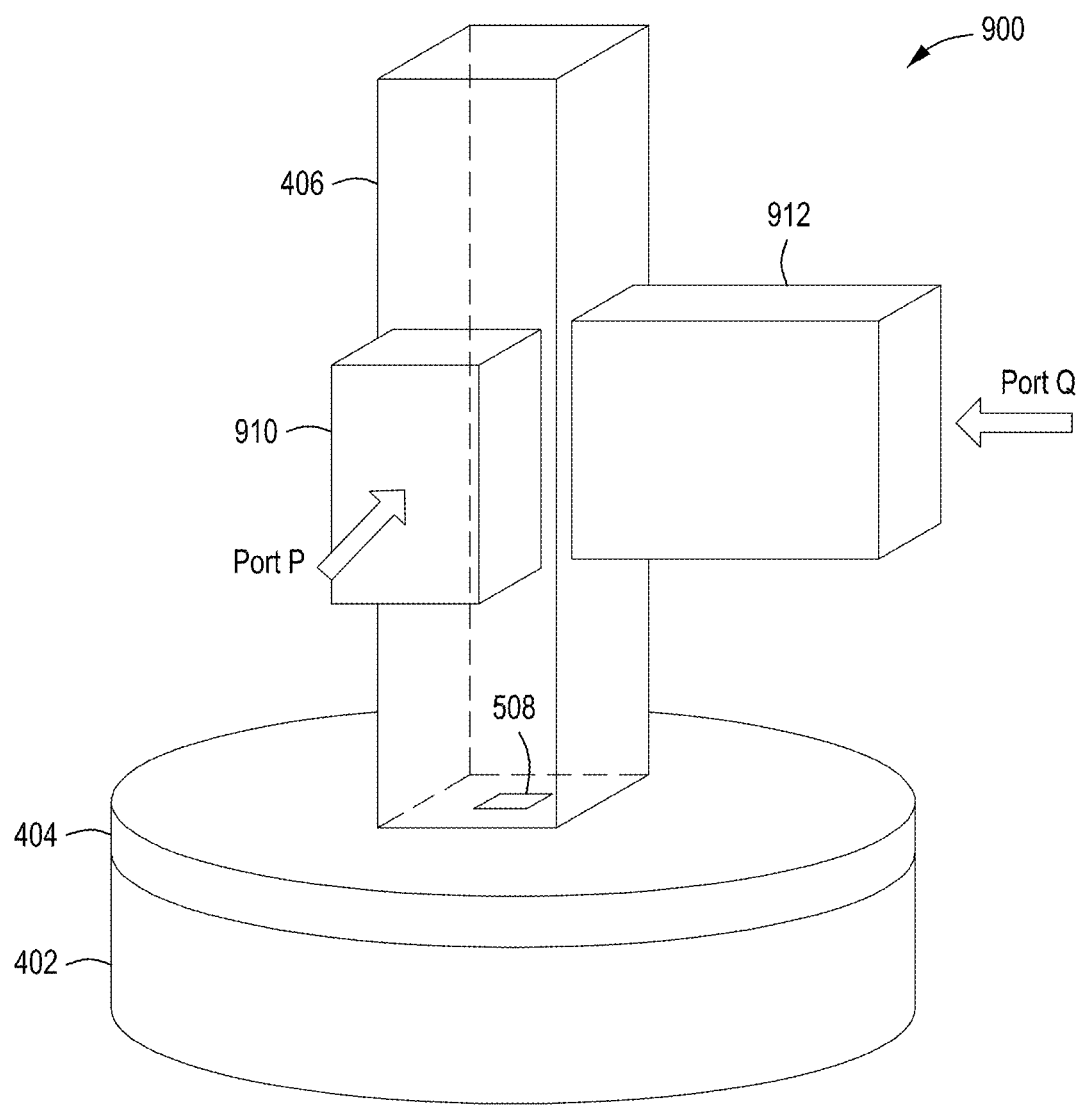
FIG. 9 depicts a two-port variant of the microwave input system of FIG. 4 in accordance with some embodiments of the present principles.

In METHODS AND APPARATUS FOR DYNAMICAL CONTROL OF RADIAL UNIFORMITY IN MICROWAVE CHAMBERS, supra, a system configuration simultaneously rotates two modes of a center (e.g., m=1 mode or $TE/TM_{1XX}$) and an edge-high (e.g., m=3 mode or $TE/TM_{3XX}$) electric field distributions, making plasma of a high uniformity. When adopting amplitude modulation to rotate the fields at a slow rotational frequency $\Omega_r/2\pi=1$ Hz to 10,000 Hz, operational electrical parameters of four ports P, Q, P', and Q' (see, id.) are shown in table 800A of FIG. 8A. In addition, the fast rotation at the same rotational frequency as a carrier frequency e.g. $\omega_r/2\pi=2.45$ GHz is summarized in table 800B of FIG. 8B. Hereafter, for brevity and not meant to be limiting, the slow rotation defined in table 800A of FIG. 8A will be used. To rotate the $TE_{111}$ in the bottom cylindrical quartz cavity 402 of FIG. 4, two orthogonal power inputs (Port P 910 and Port Q 912) are implemented as shown in FIG. 9, for which electrical parameters are set in the table 800A of FIG. 8A. The inventors have achieved results with a perfect rotation at a rotational frequency of $\Omega/2\pi$ during modeling of a microwave input system 900 of FIG. 9.

Figure 10:
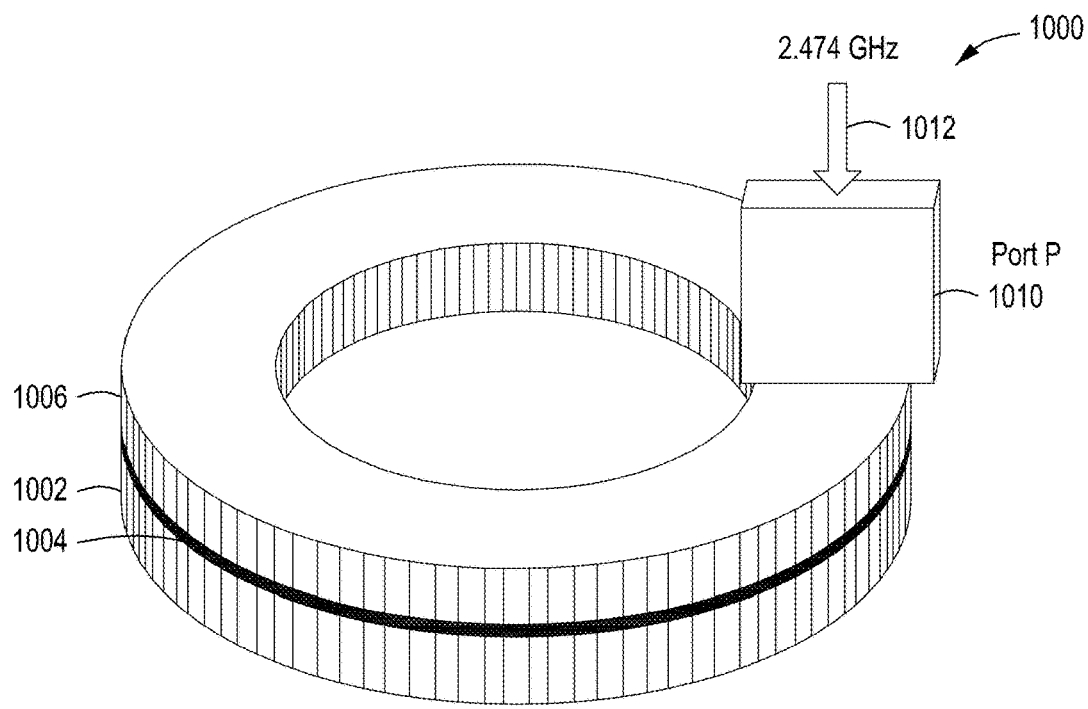
FIG. 10 depicts an isometric view of a microwave input system with a separated top toroidal cavity in accordance with some embodiments of the present principles.
Figure 11:
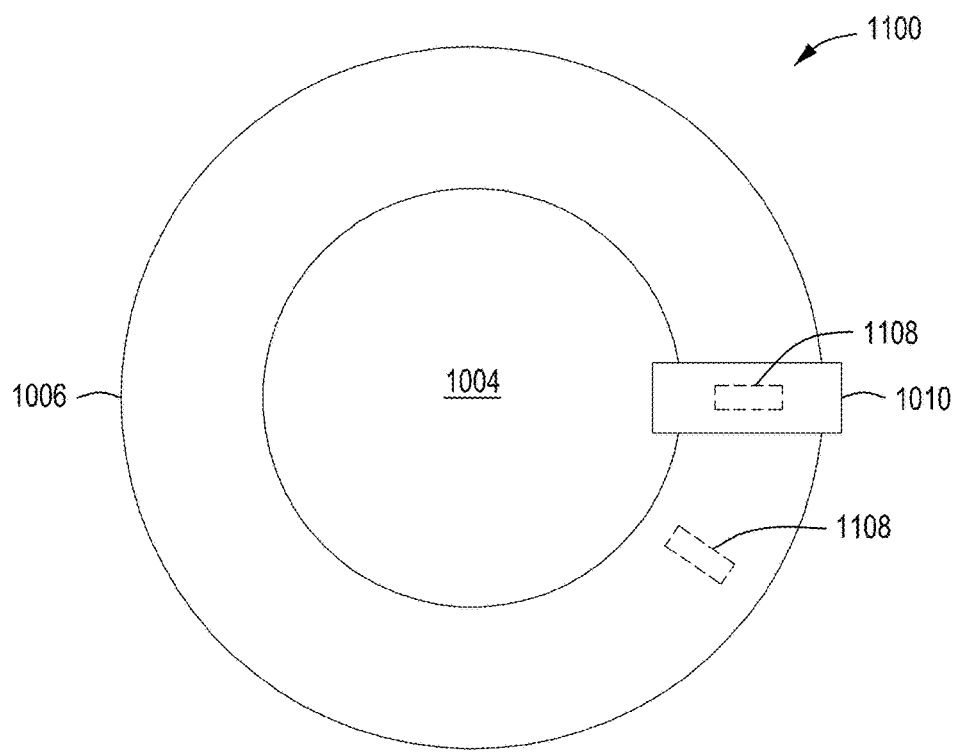
FIG. 11 depicts a top down view illustrating a pattern of radiation slots of the microwave input system of FIG. 10 in accordance with some embodiments of the present principles.
Figure 12:
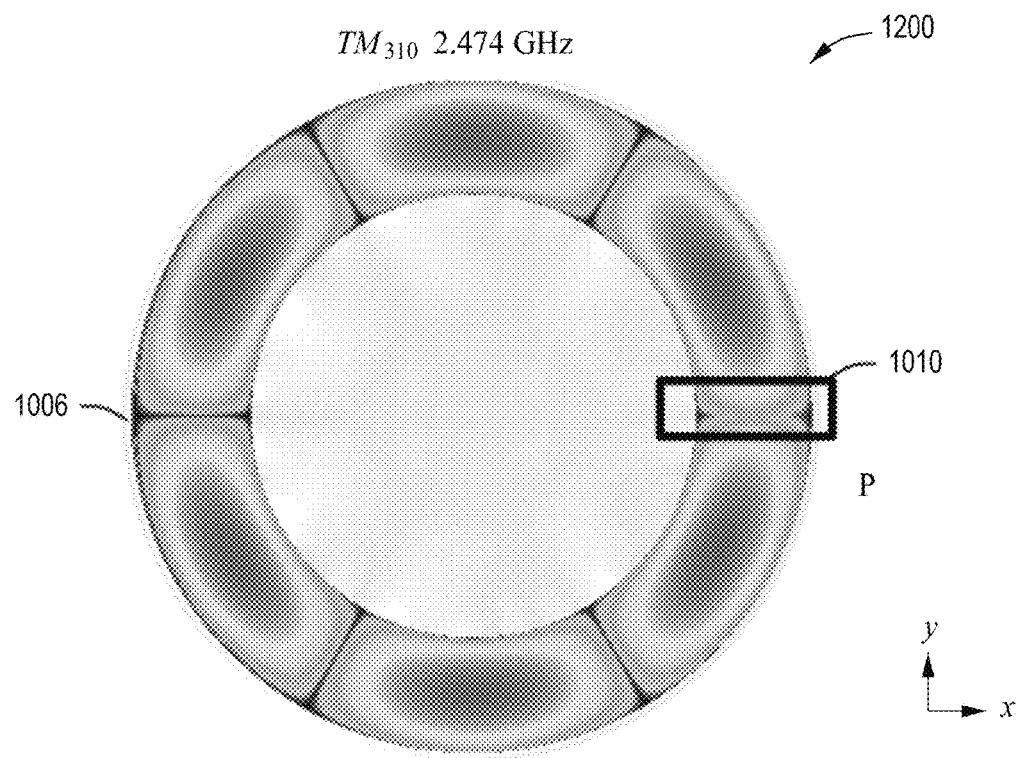
FIG. 12 depicts an electrical field plot of a top toroidal air cavity in accordance with some embodiments of the present principles.
Figure 13:
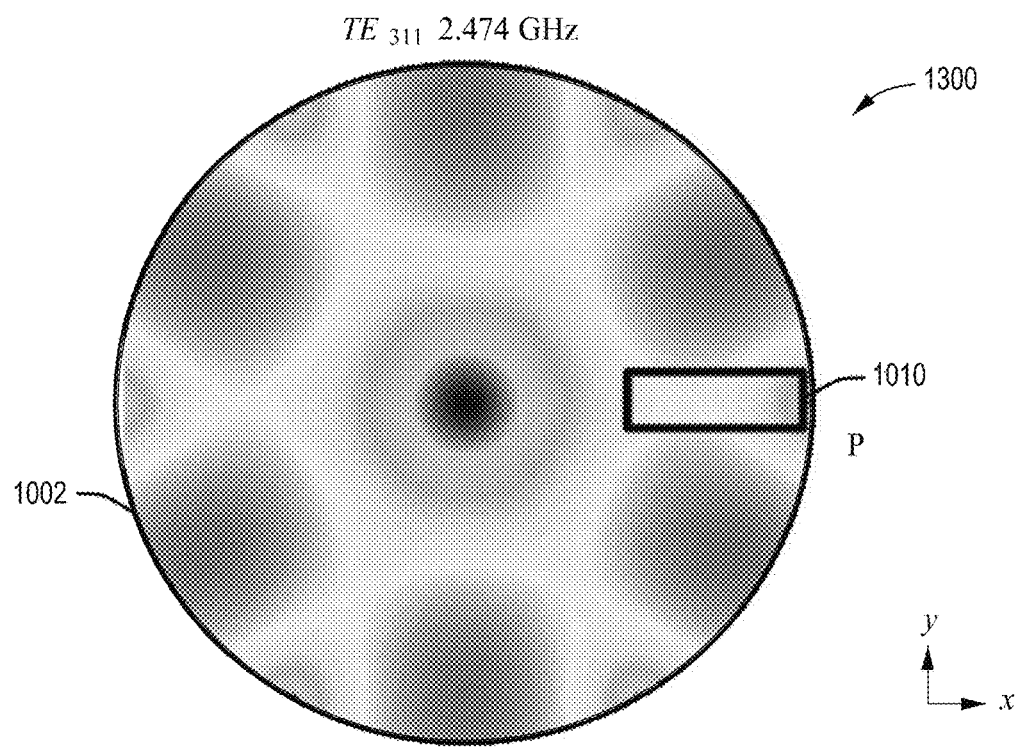
FIG. 13 depicts an electrical field plot of a bottom cylindrical quartz cavity in accordance with some embodiments of the present principles.

A top cavity for the edge high mode (e.g., m=3) can be separated as shown in a microwave input system 1000 of FIG. 10. FIG. 10 shows a combined cavity, a top toroidal air cavity 1006 and bottom cylindrical quartz cavity 1002, which are connected via radiation slots 1108 (see top down view 1100 of FIG. 11) in a metallic plate 1004. An input 1012 enters a waveguide 1010 is mounted to excite the magnetic field component $H_r$ for illustrative purposes, but any configuration can be utilized. The height of the top toroidal air cavity 1006 is arbitrarily chosen because the top toroidal air cavity 1006 is designed to excite the $TM_{310}$ (see also FIG. 12), which is independent of the height of the cavity, allowing for greater flexibility in design. A pattern of radiation slots 1108 in the metallic plate 1004 as shown in FIG. 11 is one example. Other radiation slot patterns may also be used. FIGS. 12 and 13 are a result of using a 2.474 GHz input. In the top toroidal air cavity 1006, the $TM_{310}$ mode is excited (as shown in an electric field plot 1200 of FIG. 12), the power of which transmits to the bottom cylindrical quartz cavity 1002 via the radiation slots 1108 in the metallic plate 1004, exciting the $TE_{311}$ mode in the bottom cylindrical quartz cavity 1002 as shown in an electric field plot 1300 of FIG. 13.

When exciting two modes simultaneously in a bottom cavity, by introducing the center (e.g., m=1) and edge-high (e.g., m=3) modes from a top square and top toroidal cavities, respectively, and if non-ideality from the theory exists, fine tuning may be needed. In the bottom cavity, frequency tuning may resolve the non-ideal issues, whereas in the two top cavities, mechanical tuning should be adopted. The two top cavities are designed such that each allows resonance for only one desired mode. For example, the square cavity should allow exciting of the frequency of the center-high mode (e.g., 2.417 GHz, $TE_{101}$), and the toroidal cavity should allow exciting of the frequency of the edge-high mode (e.g. 2.474 GHz $TM_{310}$).

Figure 14:
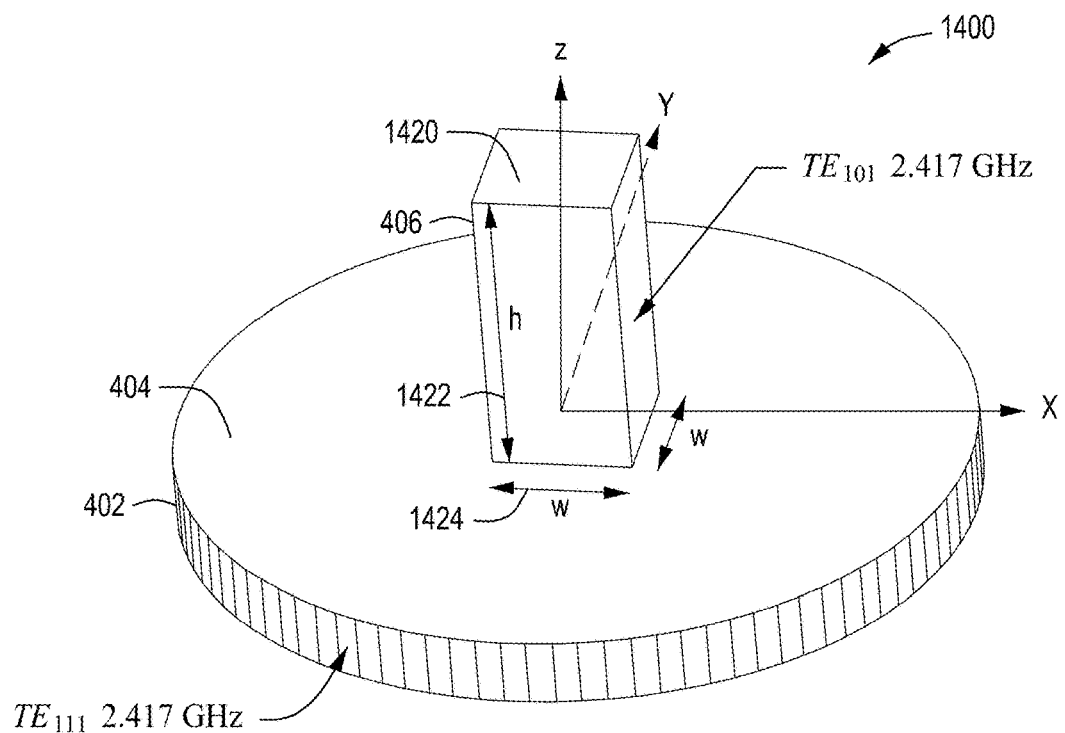
FIG. 14 depicts an isometric view of a microwave input system with a movable top plate in accordance with some embodiments of the present principles.

For the center-high mode (e.g., m=1 mode), in some embodiments, the tuning is a movable top plate 1420 like a plunging tuner as shown in a view 1400 of FIG. 14. When adjusting a height h 1422 for a fixed parameter of width w 1424, the frequency shift of the resonant frequency of $TE_{101}$ is plotted in a graph 1500 of FIG. 15. When changing the parameter of width w 1424, the available range of frequency is determined. For the edge-high mode (m=3 mode), in some embodiments, the tuning is a side wall plunging tuner 1630 as shown a top down view 1600 in FIG. 16. The wall perturbation is used to precisely excite the $TM_{310}$ (m=3) mode in the top toroidal air cavity 1006, eventually exciting the $TE_{311}$ in the bottom cylindrical quartz cavity 1002. An angle, θ, 1640 between the waveguide 1010 and the side wall plunging tuner 1630 is determined by selecting an integer, N, times π divided by 4 (θ=N×(π/4)). In the example of FIG. 16, N=3. The side wall plunging tuner 1630 can be located at any angle satisfying θ=N×(π/4).

Figure 20:
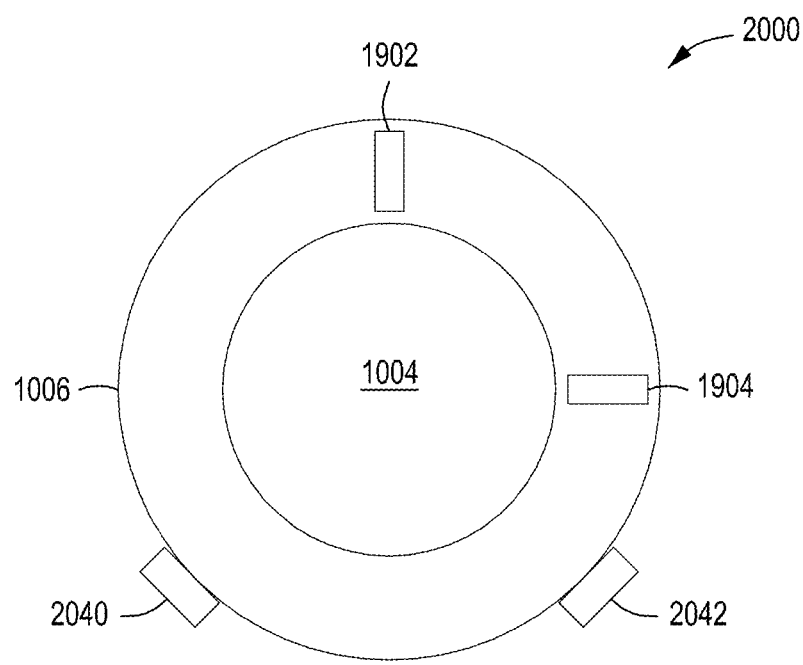
FIG. 20 depicts a top down view of a microwave input system in accordance with some embodiments of the present principles.

When using two power inputs P and Q, as will be shown in a view 2000 of FIG. 20, two identical plunging tuners, side wall plunging tuner A 2040 and sidewall plunging tuner B 2042 can be implemented to keep identical power input conditions. The side wall plunging tuners A 2040, B 2042 can also be applied to the top square air cavity 406 in FIG. 14 for $TE_{101}$ (m=1) mode. Inversely, the concept of the movable top plate 1420 can be applied to the top toroidal air cavity 1006 in FIG. 16 for m=3 mode, especially when a height dependent mode such as $TM/TE_{3x1}$ is excited in the top toroidal cavity. However, since the top toroidal air cavity 1006 is much larger than the top square air cavity 406 in FIG. 14, a movable top plate on the top toroidal air cavity 1006 would become bulky and hard to control. In graph 1700A of FIG. 17, the frequency shift is plotted as a function of the perturbation wall shift $\Delta_r$ for a fixed width of w. In graph 1700B of FIG. 17, the tuning effect appearing in the electric field distribution (at point A 1632 in FIG. 16) in the top air cavity is illustrated. In the example, the electric field near the plunging tuner is weakened, however, not so strongly perturbated from the ideal $TM_{310}$ distribution. Consequently, the slightly disturbed electric field in the top air cavity generates the ideal $TE_{311}$ distribution in the bottom cylindrical quartz cavity.

Figure 18:
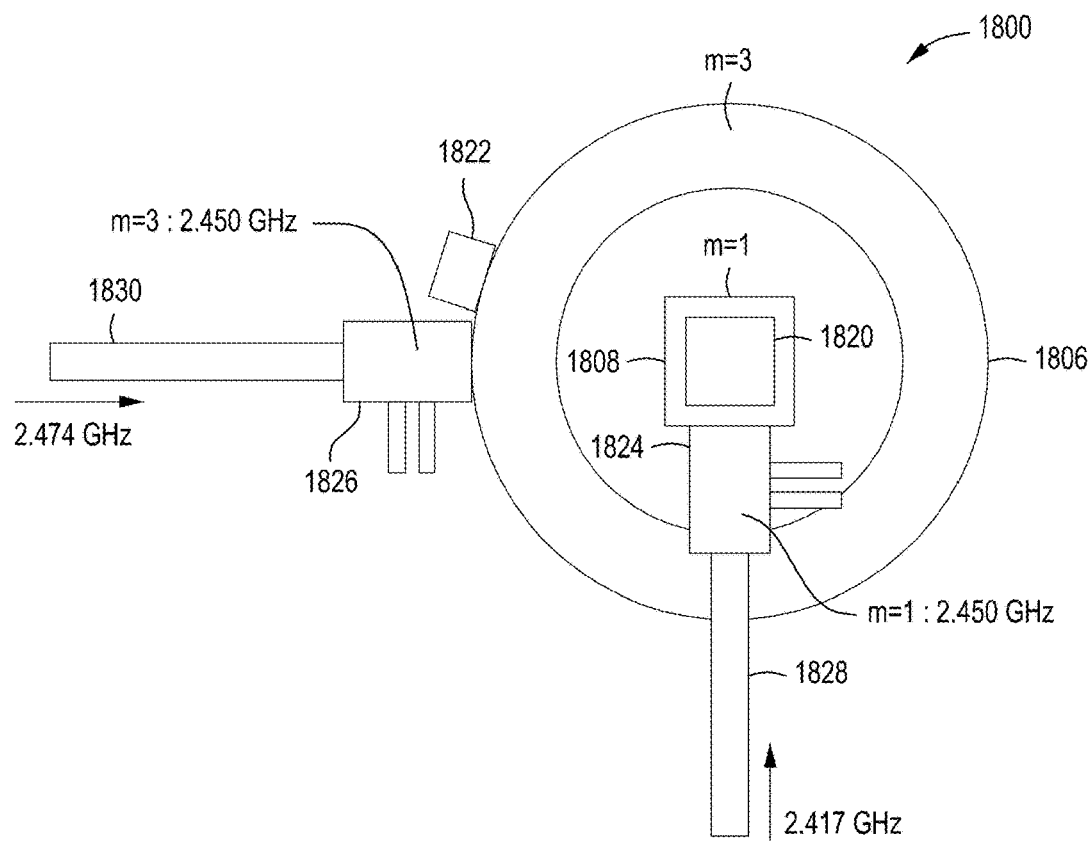
FIG. 18 depicts a top down view of a microwave input system in accordance with some embodiments of the present principles.

Besides precisely tuning the top cavities to excite the desired modes in the top and bottom cavities, the mechanical plunging tuners have an additional function. A top down view of a microwave input system 1800 of FIG. 18 shows a setup of microwave components implemented onto the aforementioned two top cavities—a top square air cavity 1808 for m=1 mode and a top toroidal air cavity 1806 for m=3 mode. The plunging tuners 1820, 1822 for m=1 and m=3, respectively, are also implemented. The position of the plunging tuner 1822 in the example of FIG. 18 is not meant to be limiting in any fashion. To avoid reflectional waves returning to the microwave generators in a 2.450 GHz band via wave guide/coax cables 1828, 1830, an auto/manual stub tuner 1824 for m=1 mode and an auto/manual stub tuner 1826 for m=3 may be implemented near each of the top cavities. As shown in the graph 1500 of FIG. 15, the microwave stub-tuner can typically control a band of 2.410 to 2.490 GHz. If the m=1 mode at 2.417 GHz and m=3 mode at 2.474 GHz are simultaneously excited, the two frequencies are in the controlling band of the microwave stub-tuners which cannot distinguish one from the other, leading to unintentional operation of the microwave stub-tuners. However, as shown in the following, the top cavities with the mechanical plunging tuners will work as practical band-pass filters. In the graph 1500 of FIG. 15, the microwave stub tuner band is split into halves, the first band 1502 and second band 1504 are assigned to the m=1 and m=3 modes, respectively. When choosing a square width of w at $w_1$ and a plunging tuner's adjustable height in-between $h_{min}$ and $h_{max}$, the top square air cavity is allowed to resonate the m=1 ($TE_{101}$) mode only in the first band 1502.

Figure 15:
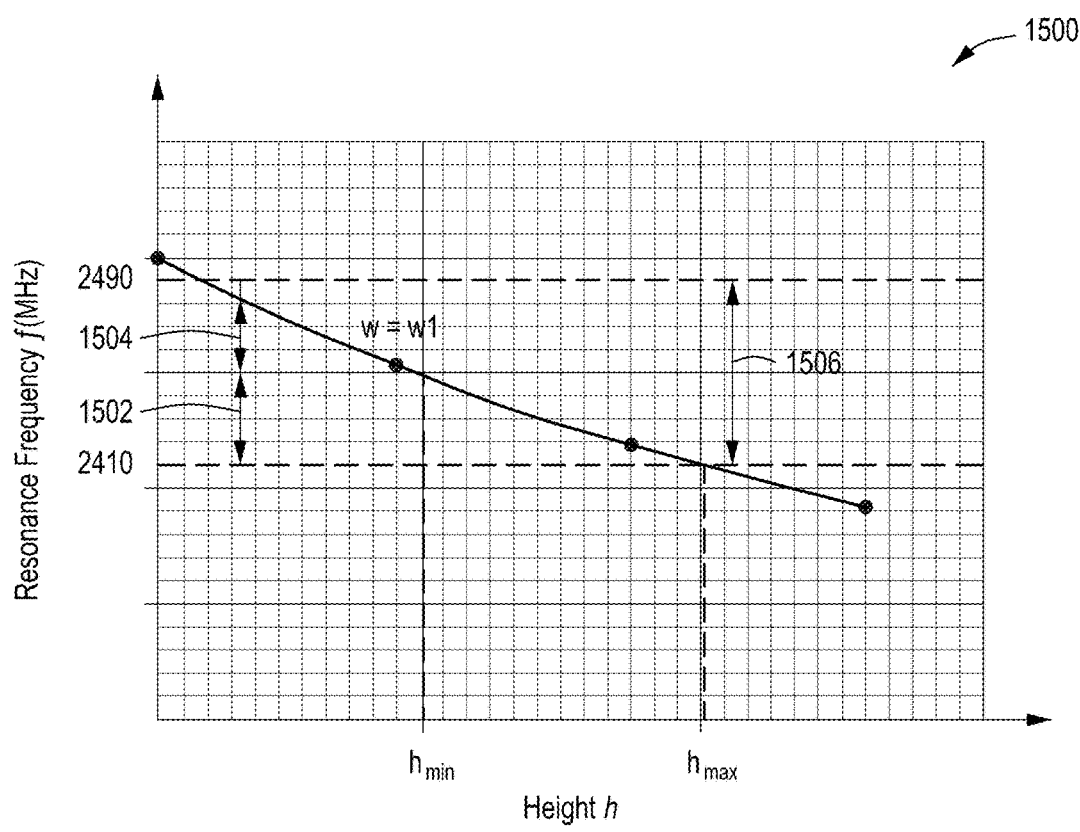
FIG. 15 depicts a graph of resonance frequencies in accordance with some embodiments of the present principles.
Figure 16:
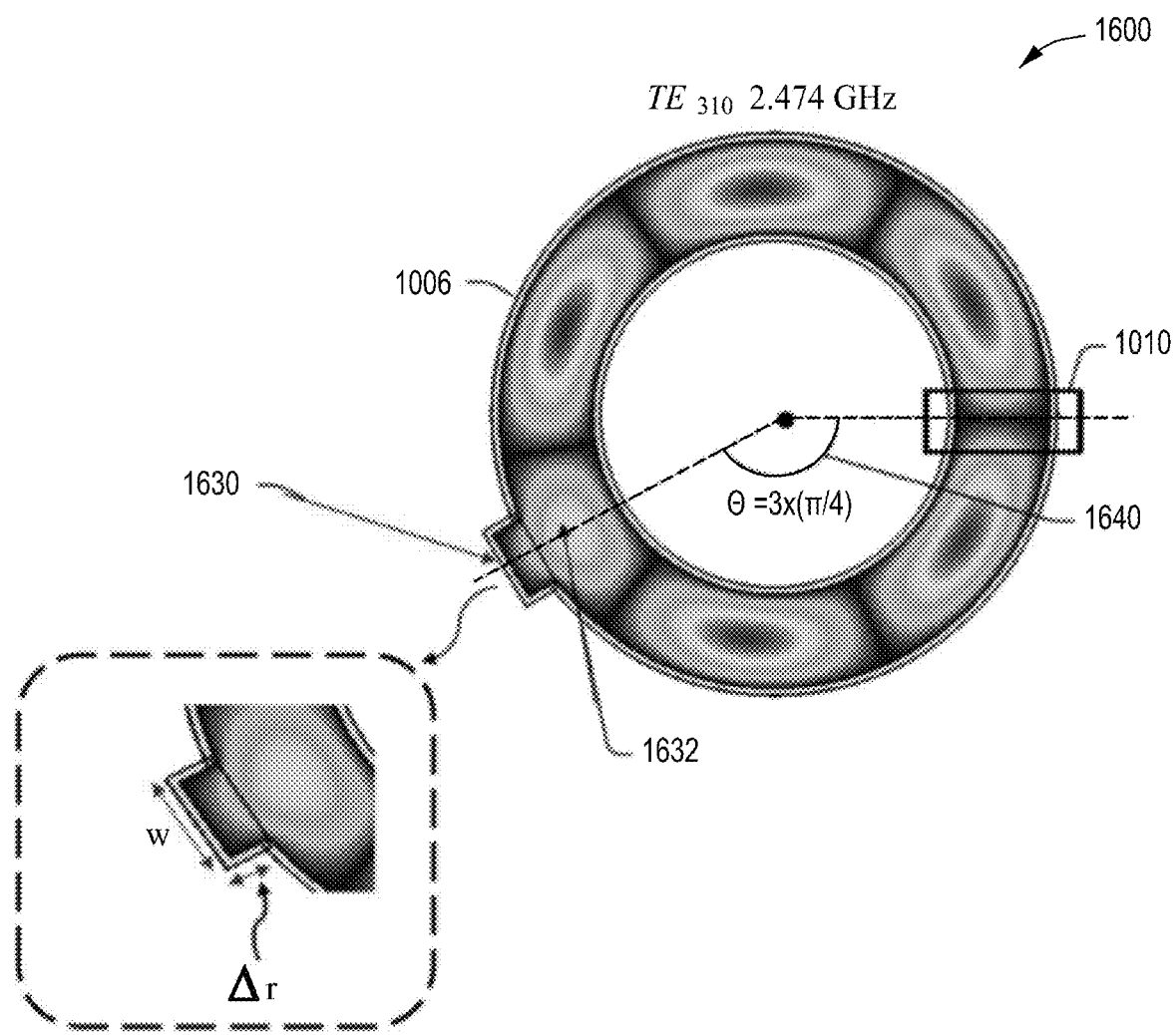
FIG. 16 depicts a top down view of electric fields in a top toroidal air cavity of a microwave input system in accordance with some embodiments of the present principles.
Figure 17:
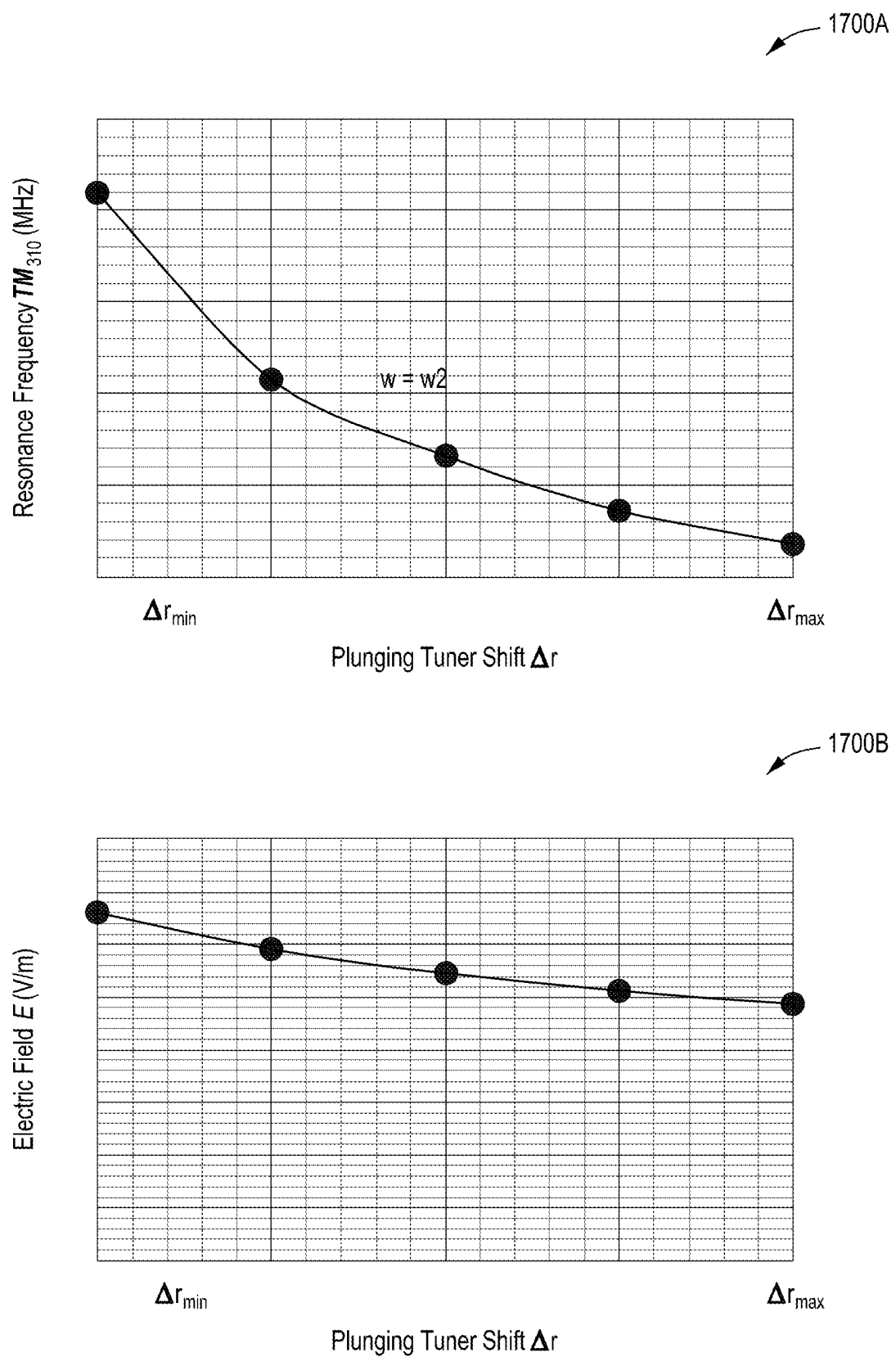
FIG. 17 depicts graphs of resonance frequency and electric field impacts of a wall plunging tuner shift in accordance with some embodiments of the present principles.
Figure 19:
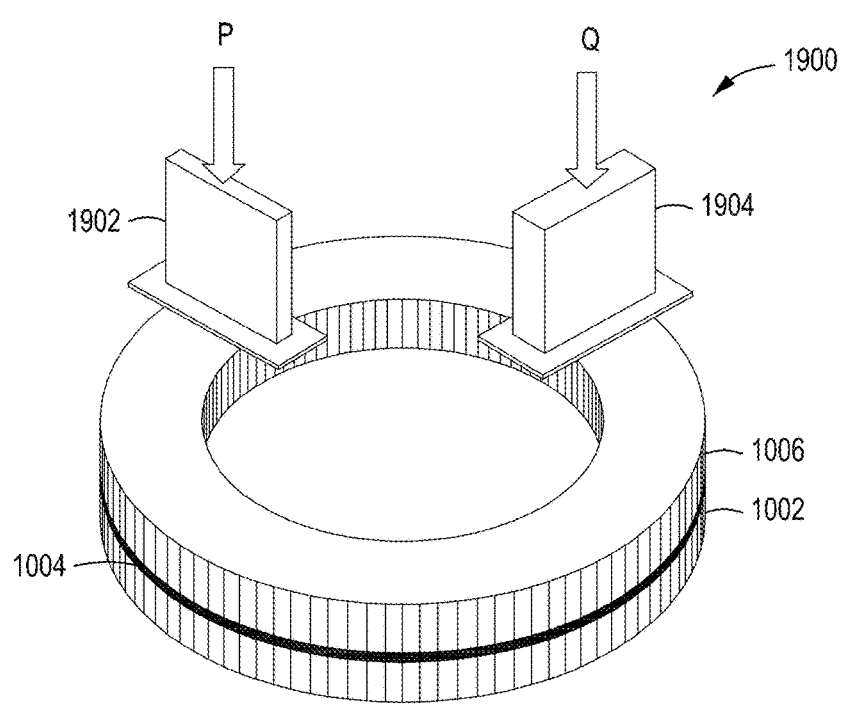
FIG. 19 depicts an isometric view of a microwave input system in accordance with some embodiments of the present principles

In a similar manner, in the graph 1700A of FIG. 17, when choosing a width w of the wall plunging tuner at w=$w_2$ and an adjustable plunging tuner shift from $\Delta r_{min}$ to $\Delta r_{max}$, resonant frequencies of the m=3 ($TM_{310}$) mode in the toroidal air cavity are limited within the second band 1504 of the stub-tuner band 1506 in the graph 1500 of FIG. 15. Under these setups of the plunging tuners 1820, 1822 in FIG. 18, when simultaneously exciting the two modes m=1 ($TE_{111}$) at 2.417 GHz and m=3 ($TM_{311}$) at 2.474 GHz in the bottom quartz cavity (not visible in top down view), the top square air cavity 1808 and top toroidal air cavity 1806 exclusively allow 2.417 and 2.474 GHz to pass inside, respectively. Consequently, each auto/manual stub tuner 1824, 1826 will work only for the assigned frequency of the auto/manual stub tuners 1824, 1826, avoiding frequency interference and accompanied malfunctions. The adjustability and bandwidth filtering of the microwave input system 1800 is extremely beneficial, reducing complexity, maintenance, and costs. To rotate the $TE_{311}$ in the bottom cavity, two orthogonal power inputs (Ports P 1902 and Q 1904) are implemented as shown in FIGS. 19 and 20, for which electrical parameters are set in the same manner as shown in the table 800A of FIG. 8A. The inventors found that testing results showed a perfect rotation at a rotational frequency of $\Omega/2\pi$.

Figure 21:
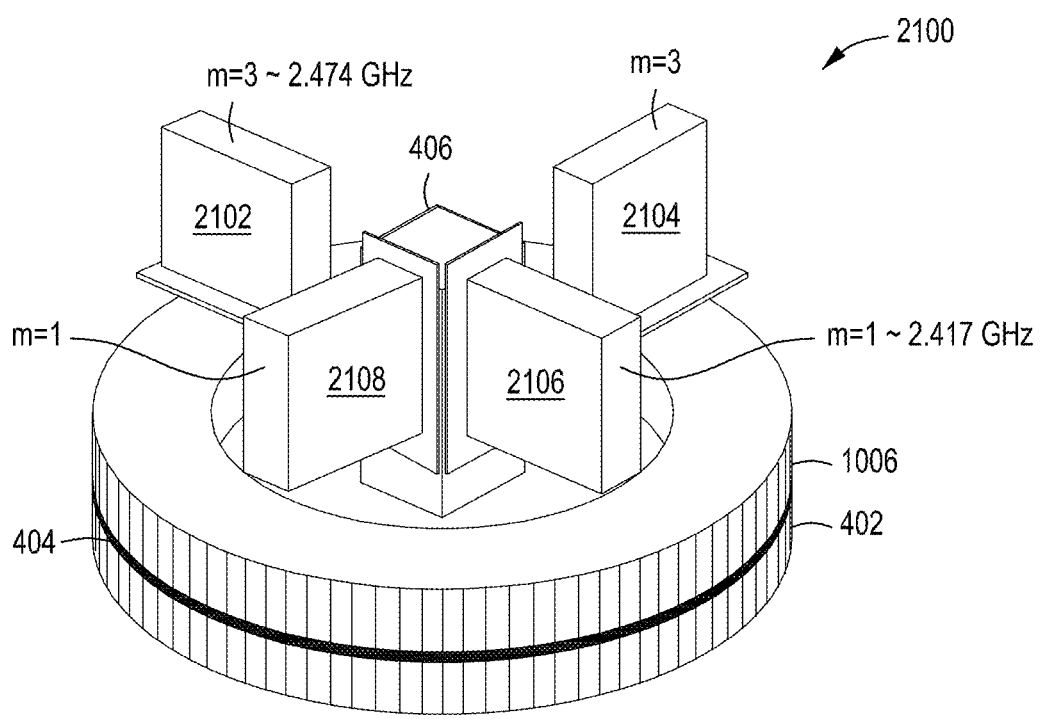
FIG. 21 depicts an isometric view of a microwave input system in accordance with some embodiments of the present principles.
Figure 22:
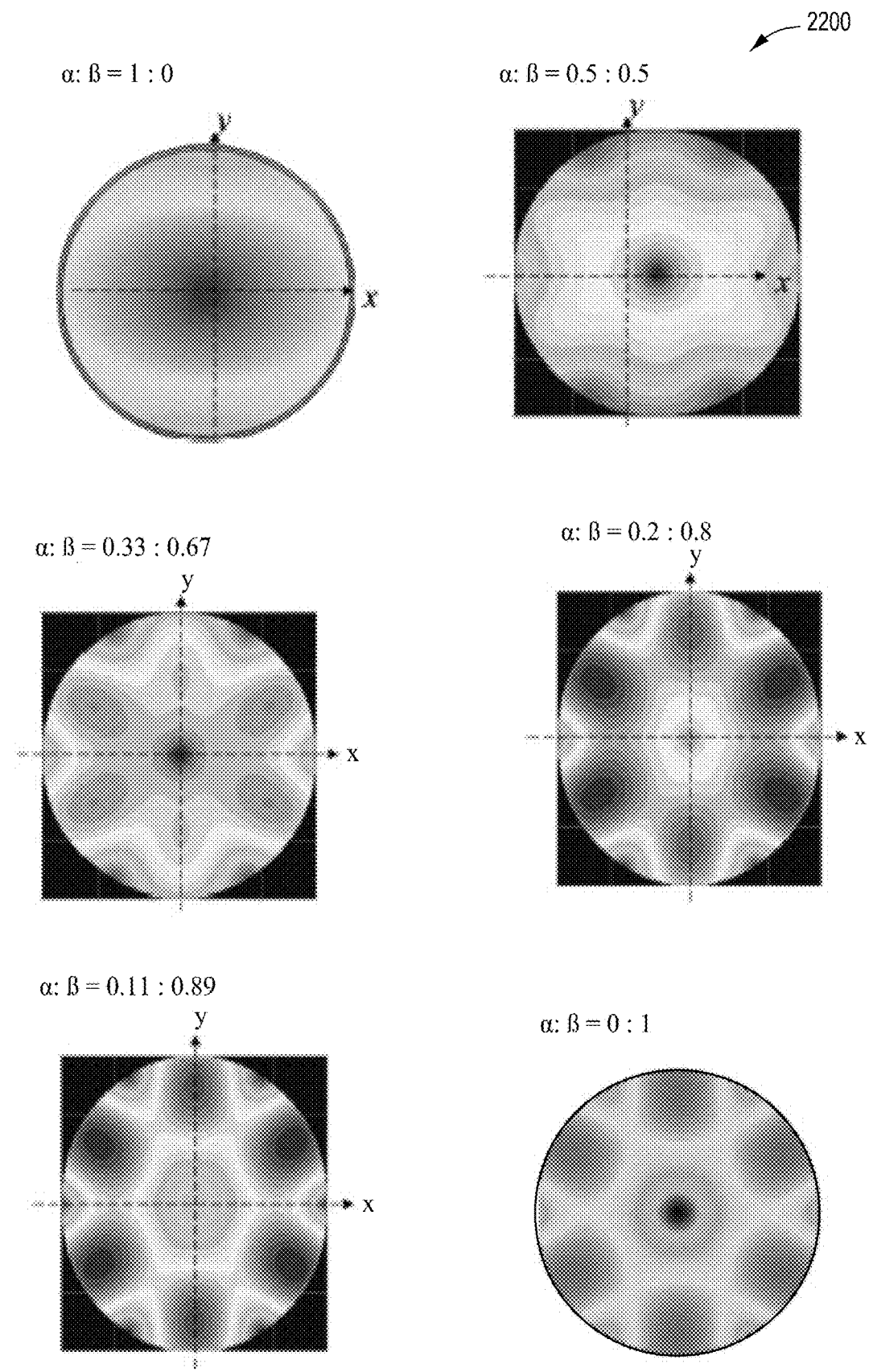
FIG. 22 depicts electrical field plots for power ratios of m=1 and m=3 modes in accordance with some embodiments of the present principles.

Combining the microwave input system 900 of FIG. 9 with the microwave input system 1900 of FIG. 19 as shown in a microwave input system 2100 of FIG. 21, the center-high mode (m=1, e.g., $TE_{111}$ at 2.417 GHz) and an edge-high mode (m=3, e.g., $TE_{311}$ at 2.474 GHz) can be simultaneously rotated in the bottom cylindrical quartz cavity 402 along with electrical parameters defined in the table 800A of FIG. 8A. In some embodiments, auto tuners are mounted on the four waveguides 2102-2108 for good rotations. Since tuners of FIGS. 14 and 16 are implemented on the two top cavities, the top square air cavity 406 and the top toroidal air cavity 1006 allow only resonances for $TE_{111}$ and $TE_{311}$, respectively. Hence, even if auto tuners with a bandwidth of 2.41-2.49 GHz are mounted, frequency interferences between $TE_{111}$ and $TE_{311}$ modes can be avoided on the auto tuners, providing approximately perfect tuning. The plots 2200 of FIG. 22 illustrate how the power ratio $\alpha:\beta$ between m=1 ($TE_{111}$ at 2.417 GHz) and m=3 ($TE_{311}$ at 2.474 GHz) changes electric field distribution in the bottom cylindrical quartz cavity, without field rotation. When rotating the electric field, azimuthally symmetric distributions will be realized as a time averaged value, particularly for a high rotational frequency over 1 kHz. The distribution with an approximate ratio of $\alpha:\beta=0.33:0.67$ is close to an optimized uniformity, generating uniform plasma both azimuthally and radially. In some embodiments, for further stable and uniform plasma generation, hundreds of holes may be formed throughout the bottom of the bottom cylindrical quartz cavity 402 (as described in *Multi-hollow plasma production along dielectric plate in microwave discharge*, S. Nakao and H. Sugai, Jap. J. App. Phys. vol. 43, L1039 (2007) and *Control of microwave plasma with use of multi-hollow dielectric plate*, I. Liang et al., Industrial Application of Plasma Process vol. 3, pp. 61 (2010)) for easy plasma ignition and subsequent stabilization without exciting plasma surface waves. The multi-hollow quartz stabilizes plasma, especially at high pressures, e.g., approximately 50 Torr to approximately 100 Torr.

Figure 23:
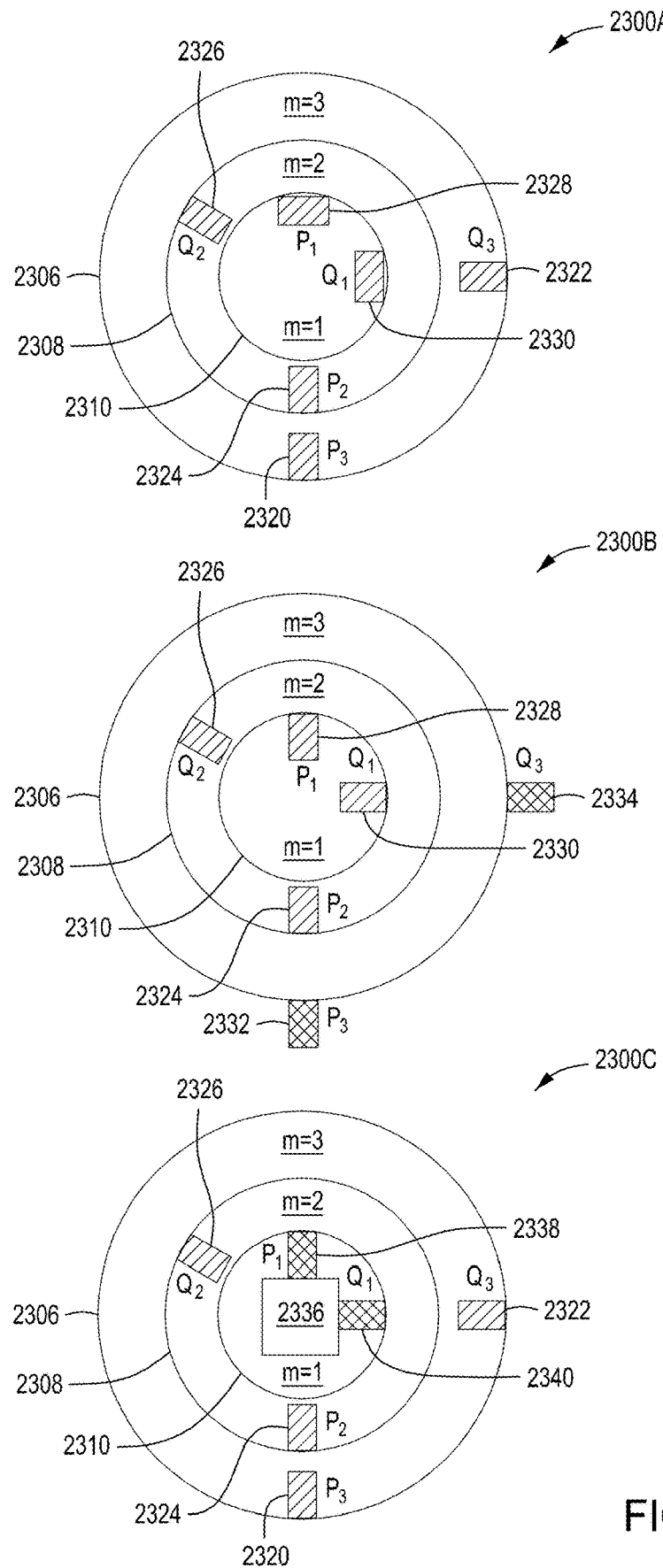
FIG. 23 depicts top down view of variants of input port orientations for microwave input systems in accordance with some embodiments of the present principles.

Microwave input systems 2300A-2300C of FIG. 23 show top views of three variations in which top and side power inputs are used in some embodiments. In microwave input system 2300A, a second top toroidal air cavity 2308 for m=2 mode is implemented in-between a first top cylindrical air cavity 2306 for m=3 mode and a third top cylindrical air cavity 2310 for m=1 mode above a bottom cylindrical quartz cavity. The first top cylindrical air cavity 2306 has top input ports $P_3$ 2320 and $Q_3$ 2322. The second top cylindrical air cavity 2308 has top input ports $P_2$ 2324 and $Q_2$ 2326. The third top cylindrical air cavity 2310 has top input ports $P_1$ 2328 and $Q_1$ 2330. The top input ports 2328, 2330 into the third top cylindrical air cavity 2310 for m=1 mode are adopted to excite the azimuthal $H_\theta$ component of the magnetic field in place of side input of the microwave input systems 200, 300 of FIGS. 2 and 3, respectively. To rotate the electrical fields, the microwave inputs for the m=1 mode and the m=3 mode are separated by 90 degrees, whereas the microwave inputs for the m=2 mode are 135 degrees apart as determined according to SYSTEMS AND METHODS FOR RADIAL AND AZIMUTHAL CONTROL OF PLASMA UNIFORMITY, supra. The microwave input system 2300B is a variation of the microwave input system 2300A. The microwave inputs for m=3 mode are changed to side input ports $P_3$ 2332 and $Q_3$ 2334 to excite the axial $H_z$ component of the magnetic field (for illustrative purposes only). In some embodiments, as shown in the microwave input system 2300C of FIG. 23, the third top cylindrical air cavity 2310 for the m=1 mode of the microwave input system 2300A is replaced with a top square cavity 2336 and top input ports $P_1$ 2328 and $Q_1$ 2330 are replaced with side input ports $P_1$ 2338 and $Q_1$ 2340. In some embodiments, any combination of cavity shapes and microwave input orientation is permitted.

The inventors have found that excitation of the m=0 mode is of special interest because m=0 (e.g., $TM_{011}$) is circularly symmetric. No rotation is required for $TM_{011}$ to give a center-high electric field with circular symmetry. In some embodiments, a simplistic implementation of the top cavity is a top coaxial air cavity 2404 and a top toroidal air cavity 2412 with a side plunging tuner 2414 as illustrated in a microwave input system 2400 of FIG. 24. Radiation slots 2424 in a metallic plate 2416 pass microwaves into a bottom cylindrical quartz cavity 2418 which produces plasma 2420 in a process volume 2422. The microwave input system 2400 also has a movable top plate 2402 for tuning on the top coaxial air cavity 2404. The tuning condition is determined by $(n\cdot\lambda)/2$ where n is an integer and $\lambda$ is a wavelength of the top coaxial air cavity 2404. Since no rotation is required for the m=0 mode, only one side input port 2406 is needed for m=0 center-high mode. Whereas the edge-high mode, e.g., m=3 mode, in the microwave input system 2400, needs two top input ports P 2408 and Q 2410 separated by 90 degrees which inject microwaves into a top toroidal cavity 2412 as illustrated in a microwave input system 2500 of FIG. 25. In some embodiments, any configuration of side and top inputs may be used for m=0 and m=3 modes. The inventors have found that by using the m=0 mode the number of input ports can be reduced which means one less power generator and one less tuner, at least, reducing costs and reducing operation complexity.

Figure 24:
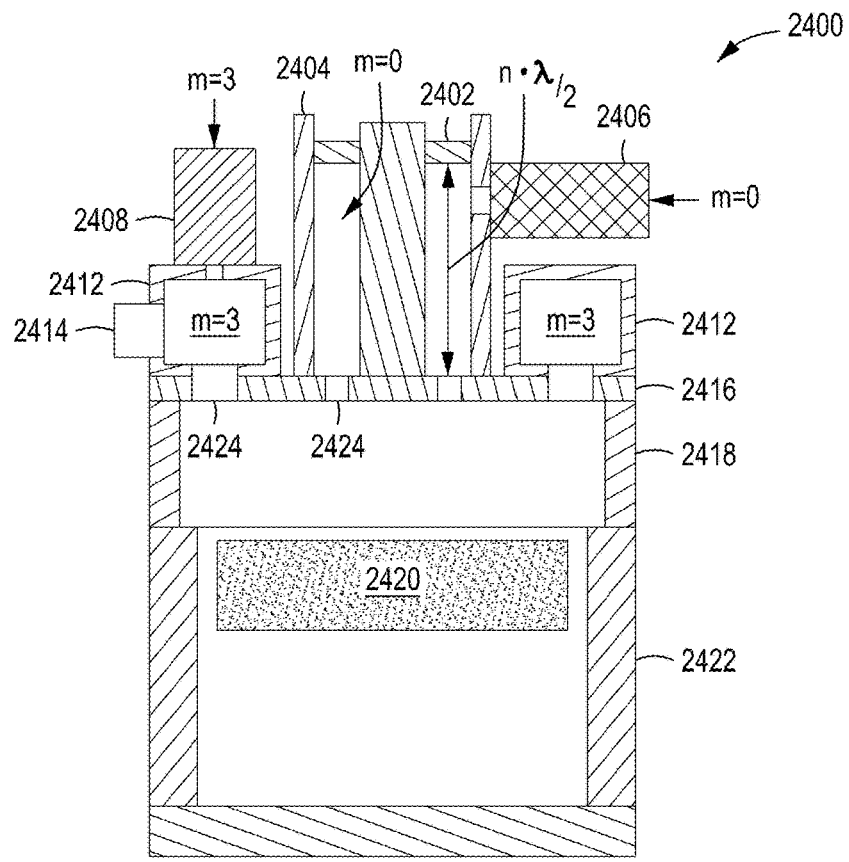
FIG. 24 depicts a cross-sectional view of a microwave input system in accordance with some embodiments of the present principles.
Figure 25:
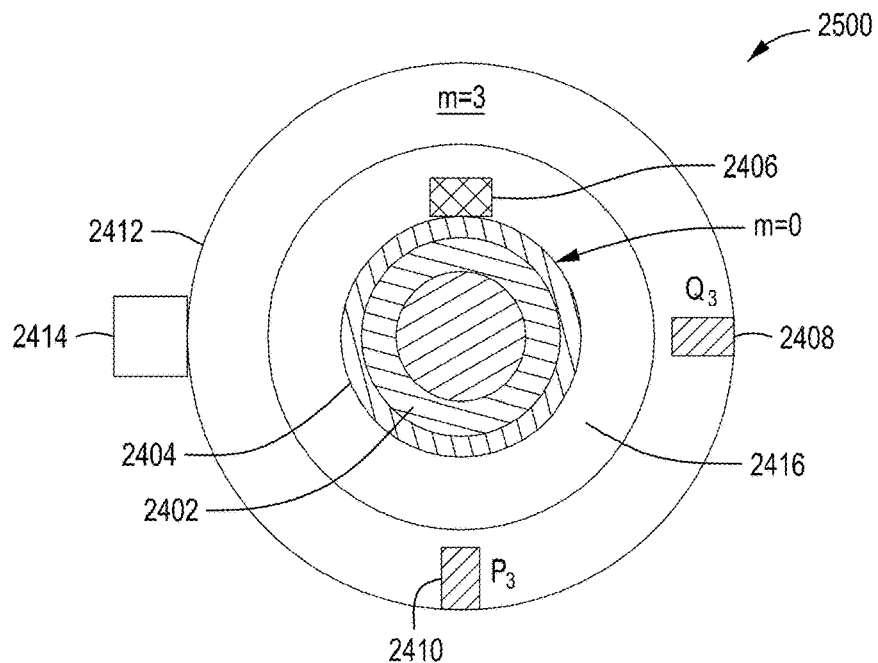
FIG. 25 depicts a top down view of the microwave input system of FIG. 24 in accordance with some embodiments of the present principles.
Figure 26:
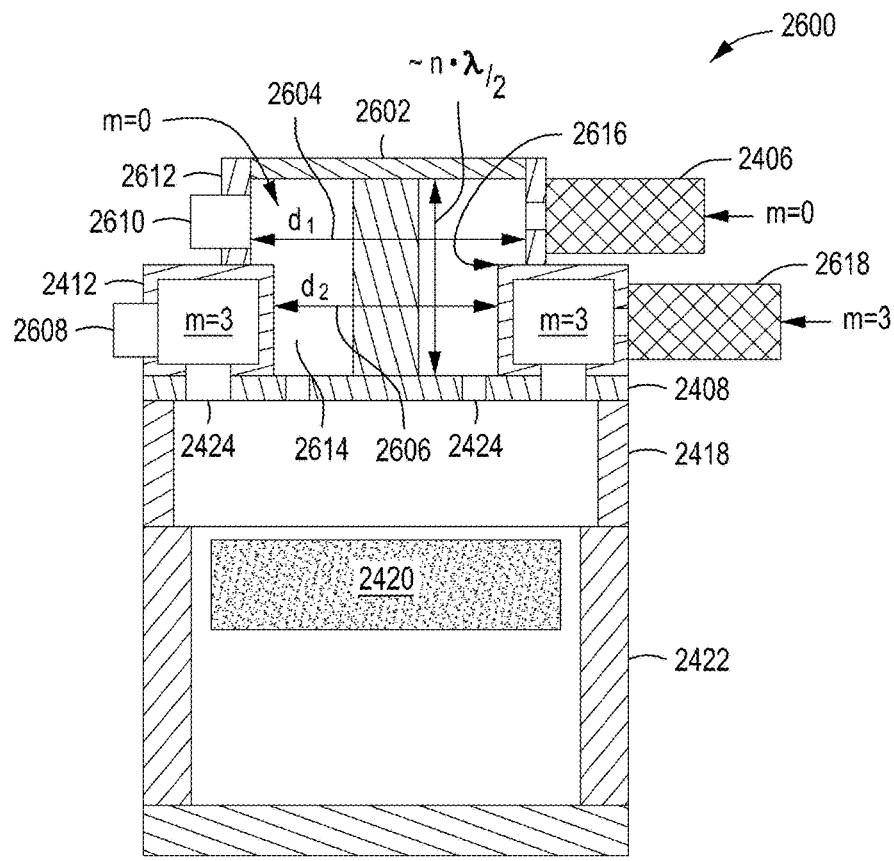
FIG. 26 depicts a cross-sectional view of a microwave input system in accordance with some embodiments of the present principles.
Figure 27:
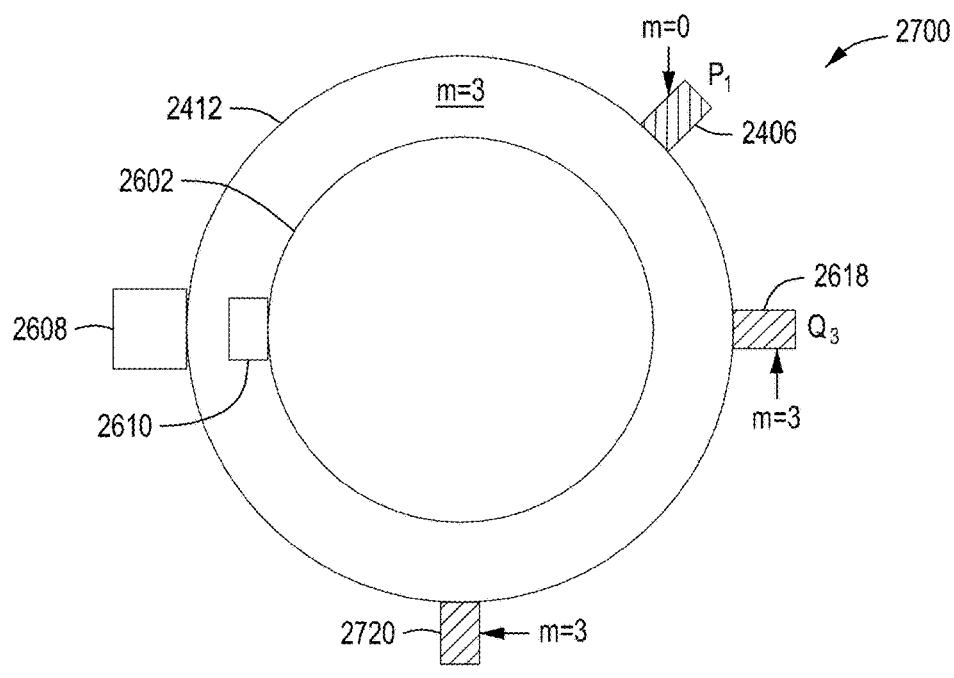
FIG. 27 depicts a top down view of the microwave input system of FIG. 26 in accordance with some embodiments of the present principles.

In some embodiments, a microwave input system 2600 of FIG. 26 for m=0 mode excitation and m=3 mode excitation is utilized which is a variation of the microwave input system 2400 of FIG. 24. A top coaxial air cavity 2602 comprises a first cylinder 2612 with diameter $d_1$ 2604 and a second cylinder 2614 with diameter $d_2$ 2606. The microwave input system 2400 includes a first side wall plunging tuner 2610 for m=0 mode of the first cylinder 2612 and a second side wall plunging tuner 2608 for m=3 mode of the top toroidal air cavity 2412. The top input ports for the m=3 mode of the microwave input system 2400 are changed to side input ports 2618, 2720 for the microwave input system 2600. In some embodiments, any combination of $d_1$ 2604 and $d_2$ 2606, including $d_1=d_2$, is permitted. In case of $d_1 \neq d_2$, the tuning height in the combined first cylinder 2612 and the second cylinder 2614 for the microwave input system 2600 of FIG. 26 is changed to $\sim(n\cdot\lambda)/2$ because of a small perturbation by a sudden change in diameter from $d_1$ to $d_2$ near the connection part 2616 of the two coaxial cavities. The microwave input system 2700 of FIG. 27 illustrates example port placements for the microwave input system 2600 of FIG. 26. The m=0 mode has a single side input port $P_1$ 2406 and the m=3 mode has a side input port $P_3$ 2720 and a side input port $Q_3$ 2618 to provide the electrical field rotation.

Figure 28:
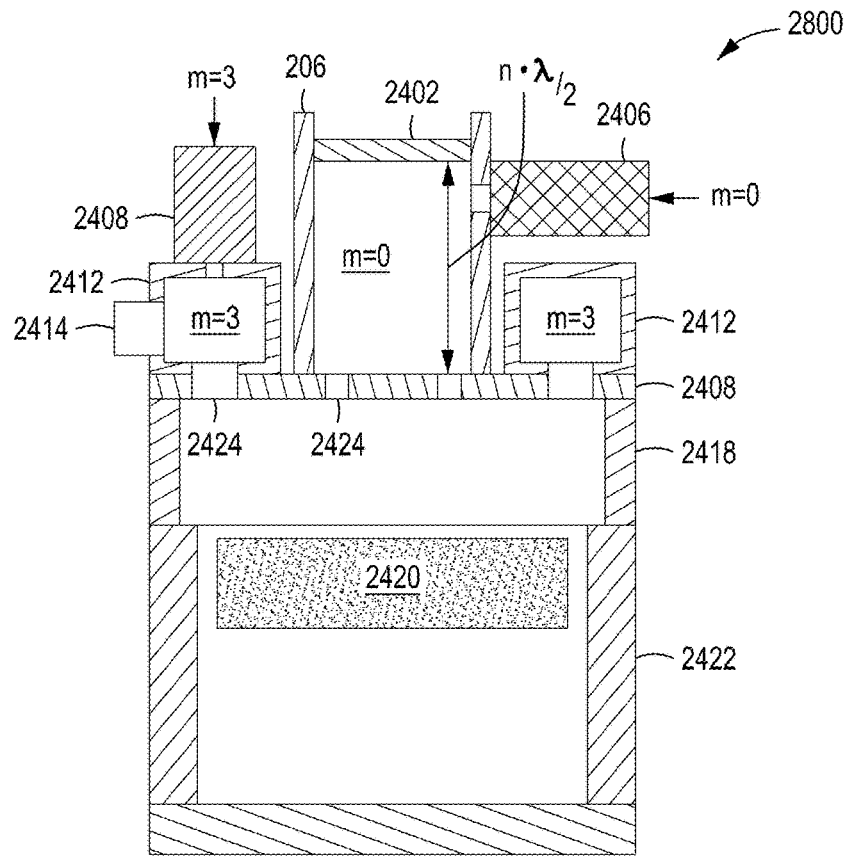
FIG. 28 depicts a cross-sectional view of a microwave input system in accordance with some embodiments of the present principles.
Figure 29:
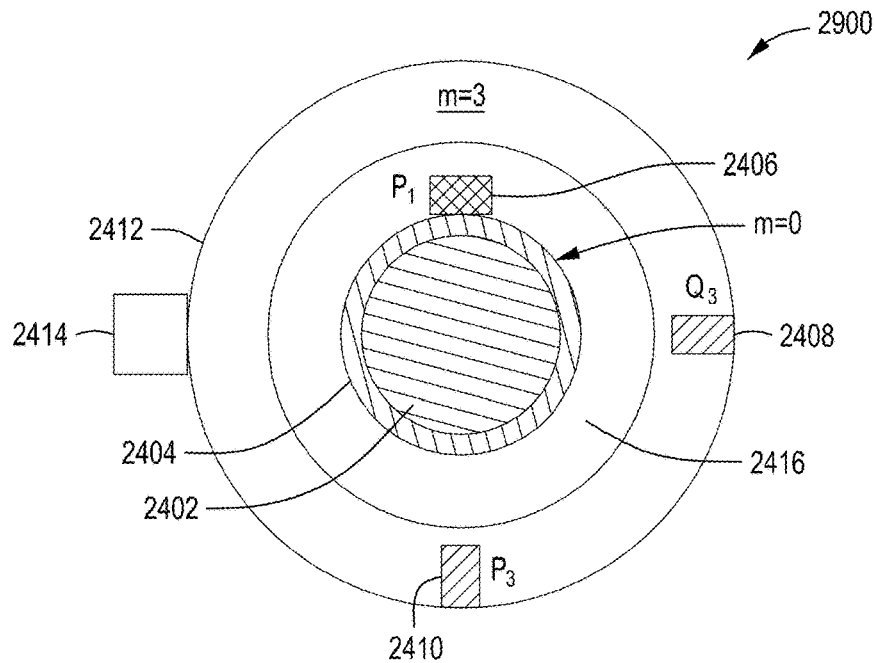
FIG. 29 depicts a top down view of the microwave input system of FIG. 28 in accordance with some embodiments of the present principles.

In some embodiments, the center-high mode, i.e., m=0, may also be excited by using the top cylindrical air cavity 206 in place of the coaxial cavity in the microwave input system 2400 and the microwave input system 2600. The use of the top cylindrical air cavity 206 is a variation of microwave input system 200 of FIG. 2, and is illustrated in microwave input system 2800 in FIG. 28. The side input port 2406 for the m=0 mode and the movable top plate 2402 are also implemented. In some embodiments, a top input port or a wall perturbation tuner may also be used for the m=0 mode. A microwave input system 2900 of FIG. 29 illustrates example port placements for the microwave input system 2700 of FIG. 27. The m=0 mode has a single side input port $P_1$ 2406 and the m=3 mode has a top input port $P_3$ 2410 and a top input port $Q_3$ 2408 to provide the electrical field rotation.

Figure 30:
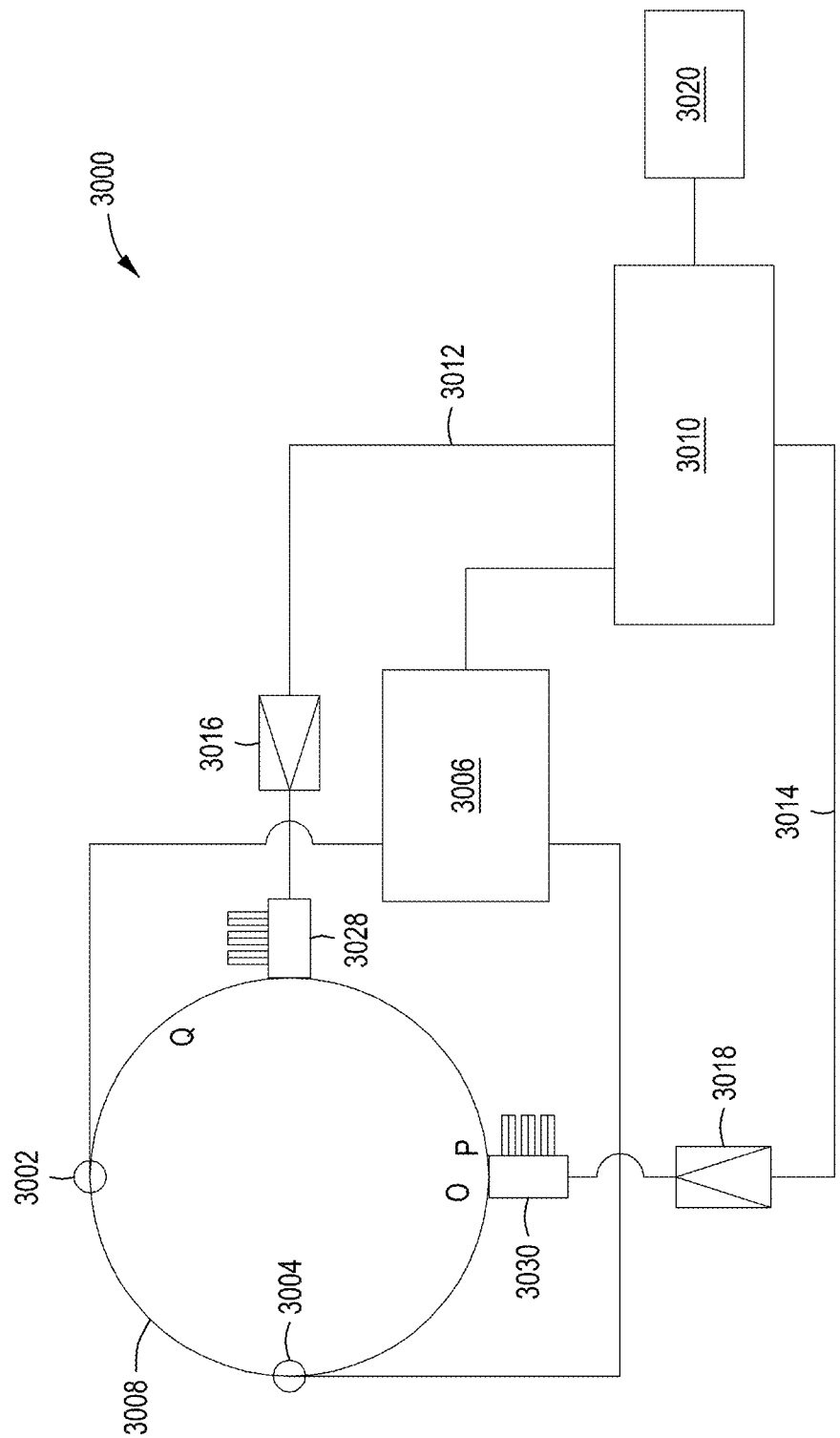
FIG. 30 depicts a schematic of a microwave input system with feedback in accordance with some embodiments of the present principles.

In FIG. 30, a microwave input system 3000 is shown with a feedback controller 3006 according to some embodiments. The microwave input system 3000 includes a user interface 3020, stub-tuners 3028, 3030, and a cylindrical cavity 3008. Microwave monitors 3002, 3004 provide microwave signals to the feedback controller 3006 which are then fed into a microwave signal (phase and amplitude) generator 3010. The microwave signal (phase and amplitude) generator 3010 sends two seed signals 3012, 3014 to two amplifiers 3016, 3018 (e.g., solid state amplifiers or electron tube amplifiers). These amplified microwave inputs are supplied to Ports P and Q, separated spatially by 90 degrees. In the example system shown in FIG. 30, the two microwave monitors 3002, 3004 are implemented together with the feedback controller 3006. If a precision digital controller such as a high frequency FPGA (field programmable gate array) is implemented inside the microwave signal (phase and amplitude) generator 3010, the microwave monitors 3002, 3004 and the feedback controller 3006 can be removed from the microwave input system 3000.

Figure 31:
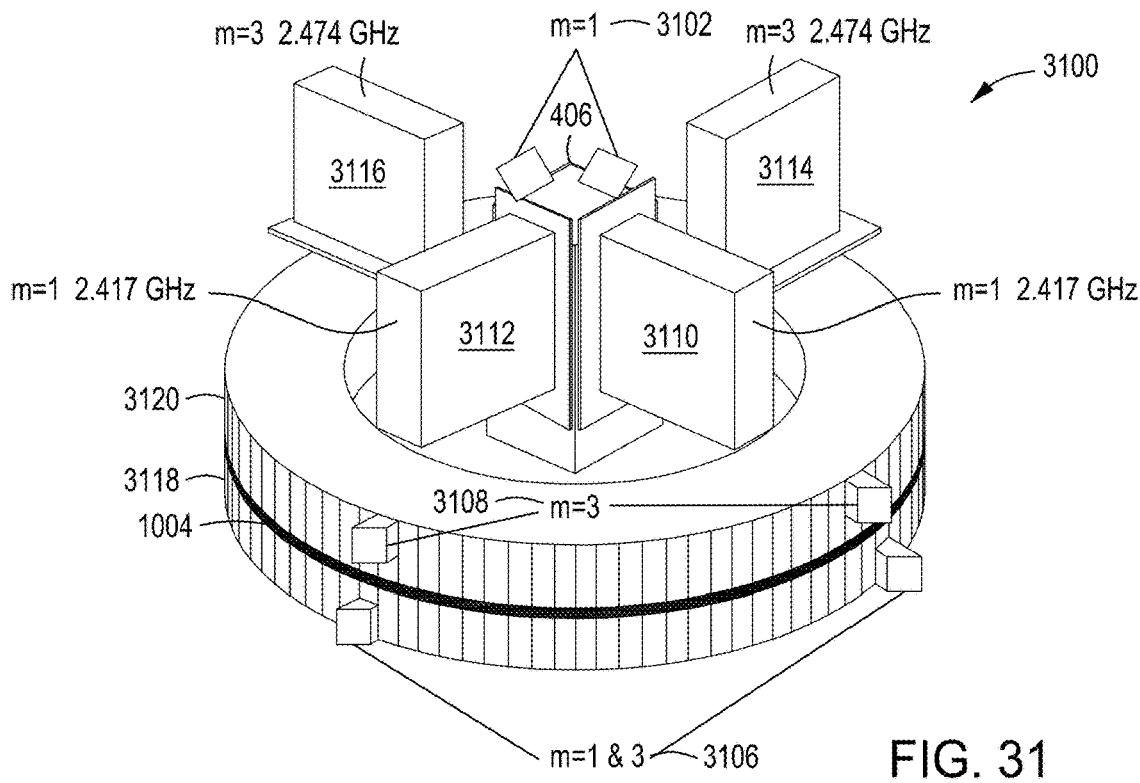
FIG. 31 depicts an isometric view of a microwave input system with microwave monitors in accordance with some embodiments of the present principles.
Figure 32:
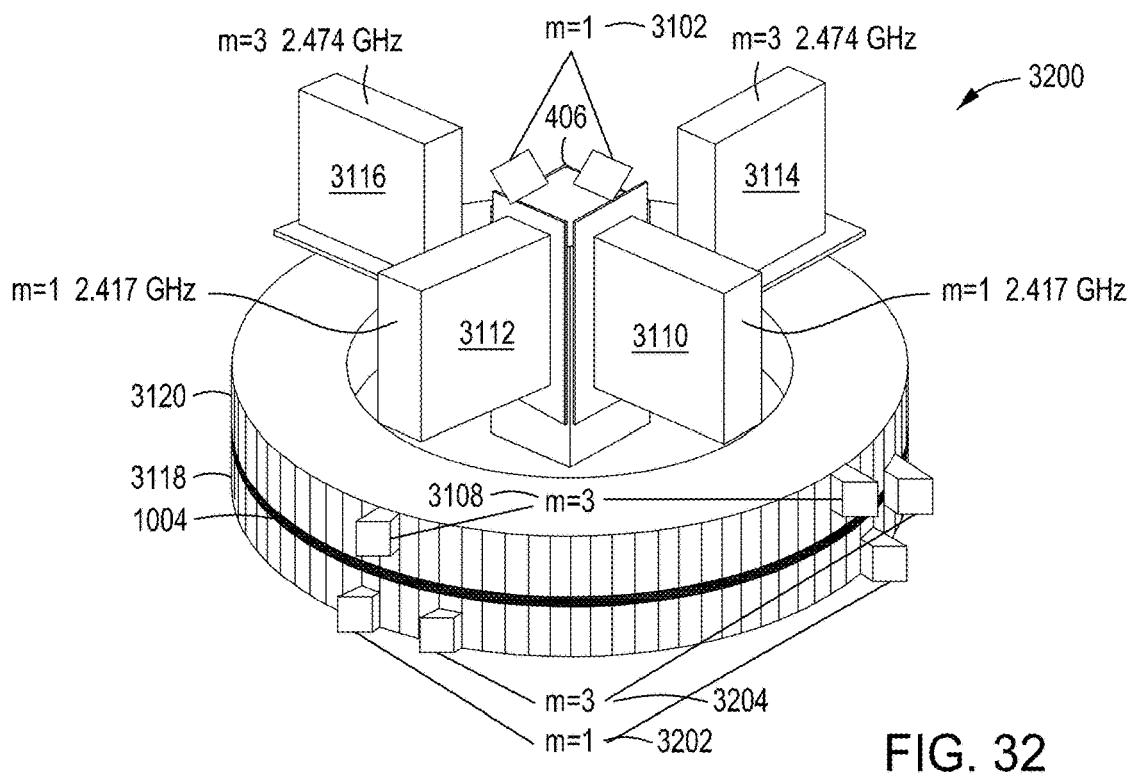
FIG. 32 depicts an isometric view of a microwave input system with microwave monitors in accordance with some embodiments of the present principles.

In some embodiments, the feedback can be used to control the two-story microwave cavities. FIG. 30 is an example of a microwave input system, in which feedback control for phase and amplitude is performed by the two microwave monitors 3002, 3004 and the feedback controller 3006. The two microwave monitors 3002, 3004 are typically placed at orthogonal positions for the m=1 and m=3 modes to each other in the pair. In the microwave input system 3000 of FIG. 30, a cylindrical cavity 3008 is assumed for illustrative purposes only. Some embodiments may have any shape and be comprised of any material, including square and/or toroidal cavities. Some embodiments have been described herein that include three cavity types—a bottom cylindrical quartz cavity, a top square air cavity, and a top toroidal air cavity. As a result, at least one of six different monitor positions may be utilized as shown in a microwave input system 3100 of FIG. 31. The microwave input system 3100 has a first input port P 3110 and a first input port Q 3112 for m=1 frequency (e.g., 2.417 GHz) and a second input port P 3114 and a second input port Q 3116 for m=3 frequency (e.g., 2.474 GHz). Each pair of microwave monitors 3102-3108 is placed in orthogonal positions to each other in the pair, because of the m=1 and m=3 modes. Any type of microwave monitor can be chosen such as pick-up coil detector and/or a crystal microwave detector and the like. In some embodiments, a first set of microwave monitors 3102 detect microwaves in the top square air cavity 406 for m=1 mode. In some embodiments, a second set of microwave monitors 3108 detect microwaves in a top toroidal air cavity 3120 for m=3 mode. In the bottom cylindrical quartz cavity 3118, in some embodiments, the two frequencies can be measured by a single microwave monitor (see, e.g., a third set of microwave monitors 3106 detect microwaves in a bottom cylindrical quartz cavity 3118). In the single microwave monitor case, two frequency processing is accomplished for each microwave monitor (e.g., m=1 mode frequency and m=3 mode frequency for the third set of microwave monitors 3106). In some embodiments, alternately, a single frequency is processed for each microwave monitor (see, e.g., monitor 3202, 3204) as illustrated in microwave input system 3200 of FIG. 32. In some embodiments, the number of microwave monitors and the position of the microwave monitors may be varied.

Figure 33:
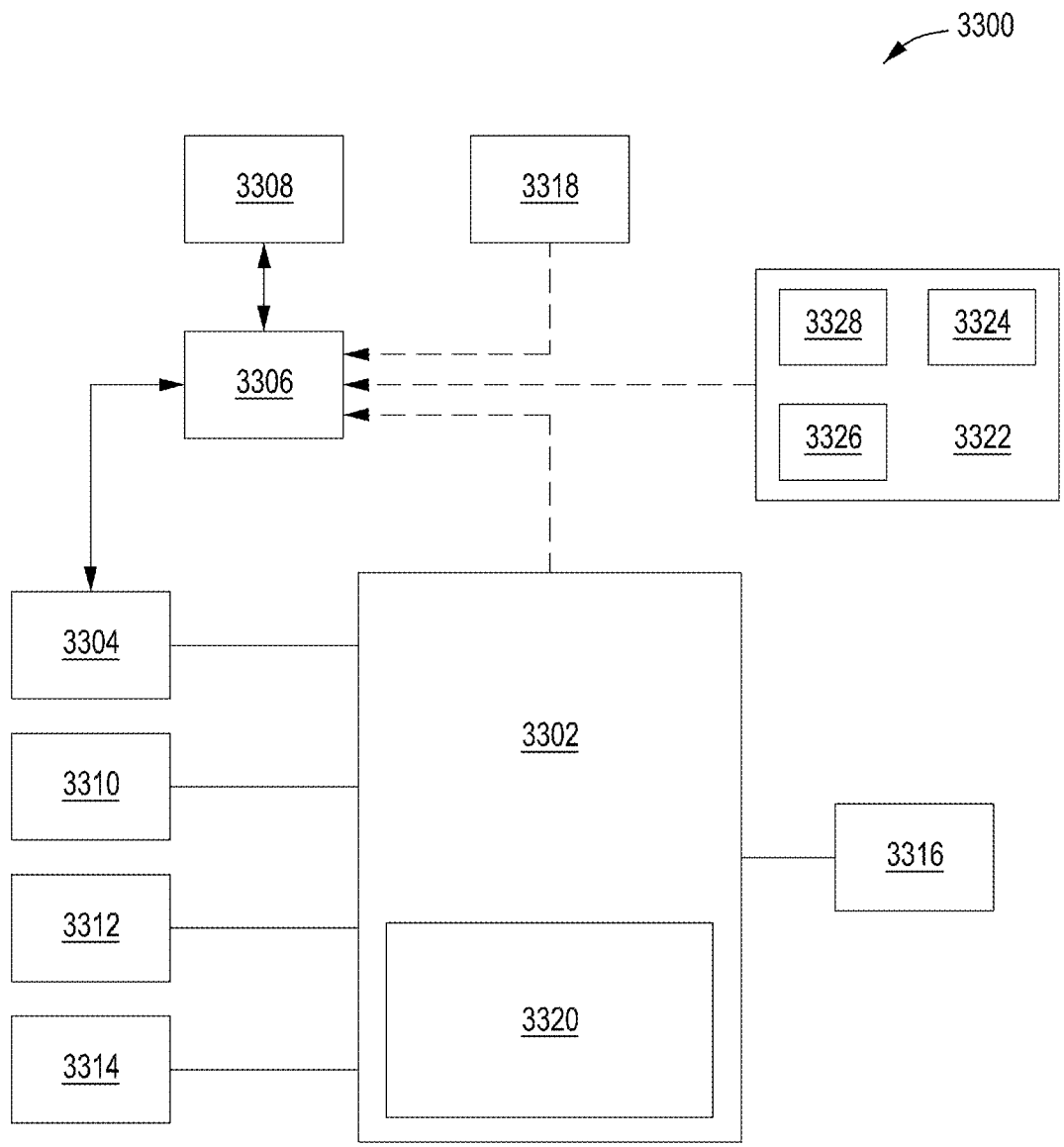
FIG. 33 is a schematic diagram of a plasma chamber with microwave inputs for plasma generation in accordance with some embodiments of the present principles.

FIG. 33 is a schematic diagram 3300 of a process chamber 3302 having a plasma chamber 3320 and microwave inputs for plasma generation in accordance with some embodiments. The process chamber 3302 has interfaces with microwave sources 3304, vacuum source 3310, gas sources 3312, power sources 3314, and a substrate interface 3316. A microwave controller 3306 interfaces with the microwave sources 3304 to control the edge-high and center-high microwave mode inputs to control plasma uniformity in the plasma chamber 3320. The microwave controller 3306 may also interface with the process chamber 3302 or the plasma chamber 3320 to receive feedback from the microwave input and/or from a resultant parameter of the processing (such as film uniformity and the like). The microwave controller 3306 may communicate with a system controller 3322 (described below) or even be a part of the system controller 3322.

The microwave controller 3306 may also interface with external devices and/or processes to receive external feedback 3318 regarding the uniformity of the processes of the plasma chamber 3320. The microwave controller 3306 can also have a user interface 3308 to receive input regarding parameters or other processing changes regarding the microwave inputs. The microwave controller 3306 may also compensate power ratios for different processes, gases, pressures, and/or physical changes of the process chamber 3302 over time (deposition build-up, etc.). The microwave controller 3306 may also adjust the power ratio to compensate for performance of components involved in the delivery of the microwave inputs such as tuners, amplifiers, transmission lines, waveguides, and/or power combiners, etc. The microwave controller 3306 may operate manually with an operator's input and/or automatically based on settings or feedback. The substrate interface 3316 allows for substrates/wafers to be loaded into and out of the plasma chamber 3320. The vacuum source 3310 permits evacuation of process gases and also a reduction in pressure when required during processing. Gas sources 3312 provide process gases and other gases used for processing or cleaning/evacuation of the plasma chamber 3320. Power sources 3314 may include radio frequency (RF) biasing power and the like as required by the processes.

The process chamber 3302 may also include a system controller 3322. The system controller 3322 includes a programmable central processing unit (CPU) 3328 that is operable with a memory 3324 and a mass storage device, an input control unit, and a display unit (not shown), such as power supplies, clocks, cache, input/output (I/O) circuits, and the liner, coupled to the various components of the processing system to facilitate control of the substrate processing. To facilitate control of the process chamber 3302 described above, the CPU 3328 may be one of any form of general purpose computer processor that can be used in an industrial setting, such as a programmable logic controller (PLC), for controlling various chambers and sub-processors. The memory 3324 is coupled to the CPU 3328 and the memory 3324 is non-transitory and may be one or more of random access memory (RAM), read only memory (ROM), floppy disk drive, hard disk, or any other form of digital storage, local or remote. Support circuits 3326 are coupled to the CPU 3328 for supporting the processor. Applications or programs for charged species generation, heating, and other processes are generally stored in the memory 3324, typically as software routine. The software routine may also be stored and/or executed by a second CPU (not shown) that is remotely located from the process chamber 3302 being controlled by the CPU 3328.

The memory 3324 is in the form of computer-readable storage media that contains instructions, when executed by the CPU 3328, to facilitate the operation of the process chamber 3302. The instructions in the memory 3324 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present disclosure.

Embodiments in accordance with the present principles may be implemented in hardware, firmware, software, or any combination thereof. Embodiments may also be implemented as instructions stored using one or more computer readable media, which may be read and executed by one or more processors such as the microwave controller 3306. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A system for generating plasma for a semiconductor process, comprising:
   a process chamber having at least two upper microwave cavities separated from a lower microwave cavity by a metallic plate with a plurality of radiation slots;
   at least one microwave input port connected to a first one of the at least two upper microwave cavities, wherein the first one of the at least two upper microwave cavities is a three dimensional rectangular cavity;
   at least two microwave input ports connected to a second one of the at least two upper microwave cavities; and
   the lower microwave cavity receives radiation through the plurality of radiation slots in the metallic plate from both of the at least two upper microwave cavities, the lower microwave cavity is configured to form an electric field that provides uniform plasma distribution in a process volume of the process chamber.

2. The system of claim 1, wherein the first one of the at least two upper microwave cavities is a square cavity.

3. The system of claim 1, wherein the first one of the at least two upper microwave cavities is an air cavity.

4. The system of claim 1, further comprising:
   a tuner on the first one of the at least two upper microwave cavities configured to adjust microwave excitation in the first one of the at least two upper microwave cavities and to act as a bandpass filter for frequencies of center-high modes.

5. The system of claim 1, wherein the second one of the at least two upper microwave cavities is a toroidal cavity.

6. The system of claim 1, wherein the second one of the at least two upper microwave cavities is an air cavity.

7. The system of claim 1, further comprising:
   a tuner on the second one of the at least two upper microwave cavities configured to adjust microwave excitation in the second one of the at least two upper microwave cavities and to act as a bandpass filter for frequencies of edge-high modes.

8. The system of claim 1, wherein the first one of the at least two upper microwave cavities supports a center-high mode of microwave excitation and the second one of the at least two upper microwave cavities supports an edge high mode of microwave excitation.

9. The system of claim 8, wherein the at least two upper microwave cavities are configured to form an electric field in the lower microwave cavity that produces a uniform plasma by adjusting a power ratio of center-high mode to edge-high mode in the at least two upper microwave cavities.

10. The system of claim 8, wherein the at least two upper microwave cavities are configured to form an electric field in the lower microwave cavity that produces a uniform plasma by adjusting a power ratio of center-high mode to edge-high mode in the at least two upper microwave cavities.

11. A system for generating plasma for a semiconductor process, comprising:
   a process chamber having at least two upper microwave cavities separated from a lower microwave cavity by a metallic plate with a plurality of radiation slots;

at least one microwave input port connected to a first one of the at least two upper microwave cavities, wherein the first one of the at least two upper microwave cavities is a coaxial air cavity;

at least two microwave input ports connected to a second one of the at least two upper microwave cavities; and the lower microwave cavity receives radiation through the plurality of radiation slots in the metallic plate from both of the at least two upper microwave cavities, the lower microwave cavity is configured to form an electric field that provides uniform plasma distribution in a process volume of the process chamber.

12. The system of claim 11, wherein the coaxial air cavity excites a TE/M$_{0XX}$ mode, where X is an integer.

13. The system of claim 11, wherein the coaxial air cavity has two different circular dimensions.

14. A system for generating plasma for a semiconductor process, comprising:

a first upper microwave cavity that excites center-high modes, wherein the first upper cavity is a three dimensional rectangular cavity;

a second upper microwave cavity that excites edge high modes, the second upper microwave cavity surrounding the first upper microwave cavity;

a metallic plate beneath the first upper microwave cavity and the second upper microwave cavity, the metallic plate has a plurality of radiation slots configured to radiate center-high modes from the first upper microwave cavity and edge-high modes from the second upper microwave cavity; and a lower microwave cavity that receives radiated center-high modes from the first upper microwave cavity and edge-high modes from the second upper microwave cavity, the lower microwave cavity configured to provide an electric field for uniform plasma distribution in a process chamber.

15. The system of claim 14, wherein the first upper microwave cavity and the second upper microwave cavity are air cavities and the lower microwave cavity is a quartz cavity.

16. The system of claim 15, wherein the quartz cavity has a plurality of holes therethrough.

17. The system of claim 15, wherein the second upper microwave cavity is a toroidal cavity surrounding the first upper microwave cavity.

18. The system of claim 15, further comprising:

a first tuner on the first upper microwave cavity configured to adjust microwave excitation in the first upper microwave cavity and to act as a bandpass filter for frequencies of center-high modes; and a second tuner on the second upper microwave cavity configured to adjust microwave excitation in the second upper microwave cavity and to act as a bandpass filter for frequencies of edge-high modes.

19. A system for generating plasma for a semiconductor process, comprising:

a first upper microwave cavity that excites center-high modes, the first upper microwave cavity being a three dimensional rectangular air cavity;

a second upper microwave cavity that excites edge high modes, the second upper microwave cavity being a toroidal air cavity that surrounds the first upper microwave cavity;

a metallic plate beneath the first upper microwave cavity and the second upper microwave cavity, the metallic plate has a plurality of radiation slots configured to radiate center-high modes from the first upper microwave cavity and edge-high modes from the second upper microwave cavity; and a lower microwave cavity that receives radiated center-high modes from the first upper microwave cavity and edge-high modes from the second upper microwave cavity, the lower microwave cavity being a cylindrical quartz cavity with a plurality of holes therethrough that is configured to provide an electric field for uniform plasma distribution in a process chamber.

20. The system of claim 19, further comprising:

a first tuner on the first upper microwave cavity configured to adjust microwave excitation in the first upper microwave cavity and to act as a bandpass filter for frequencies of center-high modes; and a second tuner on the second upper microwave cavity configured to adjust microwave excitation in the second upper microwave cavity and to act as a bandpass filter for frequencies of edge-high modes, wherein the first upper microwave cavity and the second upper microwave cavity are configured to generate an electric field in the lower microwave cavity that produces a uniform plasma by adjusting a power ratio of center-high mode to edge-high mode in the first upper microwave cavity and the second upper microwave cavity, respectively.

* * * * *